United States Patent
Kawai et al.

[11] Patent Number: 6,057,688
[45] Date of Patent: May 2, 2000

[54] RESIDUAL CAPACITY DETECTING APPARATUS FOR AN ELECTRIC VEHICLE'S BATTERY AND A RELATED RESIDUAL CAPACITY MEASURING METHOD

[75] Inventors: Toshiyuki Kawai, Okazaki; Yuichi Sakajo, Aichi-ken; Tomoya Katoh, Nagoya, all of Japan

[73] Assignees: Denso Corporation, Kariyo, Japan; Nippon Soken, Inc., Nishio, Japan

[21] Appl. No.: 09/034,365

[22] Filed: Mar. 4, 1998

[30] Foreign Application Priority Data

Mar. 5, 1997 [JP] Japan ................................. 9-050496

[51] Int. Cl.$^7$ ................................. G01R 27/00
[52] U.S. Cl. ........................... 324/428; 324/426
[58] Field of Search ................. 324/428, 427, 324/426, 429, 434, 430, 433, 435; 320/48; 340/636; 360/483

[56] References Cited

U.S. PATENT DOCUMENTS

| | | | |
|---|---|---|---|
| 5,193,067 | 3/1993 | Sato et al. | 324/483 |
| 5,479,085 | 12/1995 | Honda et al. | 320/48 |
| 5,680,050 | 10/1997 | Kawai et al. | 324/427 |
| 5,721,688 | 2/1998 | Bramwell | 364/483 |
| 5,723,971 | 3/1998 | Sakai et al. | 320/30 |

FOREIGN PATENT DOCUMENTS 7-55903  3/1995  Japan .

*Primary Examiner*—Josie Ballato
*Assistant Examiner*—T. R. Sundaram
*Attorney, Agent, or Firm*—Pillsbury Madison & Sutro LLP

[57] ABSTRACT

A reduction in the discharge voltage, caused due to a memory effect of a battery, is checked during a discharge operation. An initial discharge characteristic curve, representing an initial relationship between the discharge voltage and the discharge amount of the battery, is parallel shifted so as to coincide with the actual discharge condition, thereby obtaining an estimated discharge characteristic curve in a non-discharged region.

5 Claims, 18 Drawing Sheets

RESIDUAL CAPACITY DETECTING APPARATUS FOR AN ELECTRIC VEHICLE'S BATTERY AND A RELATED RESIDUAL CAPACITY MEASURING METHOD

BACKGROUND OF THE INVENTION

The present invention relates to a residual capacity detecting apparatus which is preferably employed for detecting the residual capacity of a battery installed on an electric automotive vehicle, and a related method for measuring the residual battery capacity.

Conventionally, an electric automotive vehicle has a battery equipped with a residual capacity detector. For example, when a lead battery is installed on an automotive vehicle, the initial discharge characteristics of this lead battery is stored in a memory as table data beforehand. The initial discharge characteristics represents a relationship between a discharge voltage and a corresponding residual capacity of the lead battery in a green state. A terminal voltage of the battery is measured during a discharge operation. Then, referring to the table data stored in the memory, a momentary residual capacity of the battery is calculated based on the measured discharge voltage.

Besides the lead batteries, alkaline batteries have been recently used as electric power sources for electric automotive vehicles because of their large energy densities. Ni—MH batteries and Ni—Cd batteries are representative alkaline batteries. Like lead batteries, the alkaline batteries are secondary batteries which can be used repetitively by recharging.

However, alkaline batteries cause a so-called memory effect (i.e., memory phenomenon) as a result of repetitive charge and discharge operations unless they are fully discharged until the residual capacity is completely reduced to a predetermined discharge terminal voltage. Generally, the discharge characteristics of a battery is represented by a relationship between its discharge voltage and a corresponding residual capacity. For example, the discharge characteristic obtained in a green state of the battery is referred to as initial discharge characteristics.

The problem arising with an alkaline battery causing the memory effect is that its discharge characteristics momentarily varies in accordance with the memory effect. Thus, the discharge characteristics of a used battery possibly differs from its original (i.e., initial) discharge characteristics.

Accordingly, an error may be caused in a calculation of the residual battery capacity when the memory effect of the battery is neglected and the residual capacity is calculated based solely on the pre-stored initial discharge characteristics.

In this respect, Unexamined Japanese patent application No. 7-55903 proposes a residual capacity measuring method for a battery, according to which a discharge amount is calculated by integrating momentary values of the discharge current during a discharging operation. Then, a residual battery capacity is calculated by subtracting the calculated discharge amount from a predetermined full charge capacity (corresponding to 100% residual capacity).

However, according to this conventional art, the following problems will arise.

An electric automotive vehicle consumes electric energy stored in a battery to travel. Accordingly, it is preferable to calculate the residual capacity of a Ni—MH battery in terms of energy (Wh), i.e., using three factors of voltage (V), current (A) and time (h).

However, the above-described conventional art obtains the residual battery capacity in terms of the units of Ah which is not relevant to the energy (Wh).

In a system using a battery, the electric power is generally supplied from the battery. When a battery is subjected to the memory effect, there is a tendency that its discharge current becomes large in response to its discharge voltage lowered due to the memory effect. Accordingly, the battery causing the memory effect tends to discharge earlier compared with a battery free from the memory effect.

Furthermore, it is inevitable that a battery is deteriorated during a long time usage. Thus, an actual full charge capacity of a used battery will be lowered compared with a predetermined full charge amount (i.e., a rated value). In such a case, the battery may have no available capacity irrespective of an indication of a significant amount of residual capacity.

SUMMARY OF THE INVENTION

In view of the foregoing problems encountered in the prior art, the present invention has an object to provide a residual capacity detecting apparatus for a battery which is capable of accurately detecting the residual capacity of a repetitively chargeable battery which is often subjected to the memory effect, considering the presence of the deterioration of the battery. Furthermore, the present invention provides a related method for accurately measuring the residual battery capacity.

In order to accomplish the above-described and other related objects, the present invention provides a residual capacity detecting apparatus for a battery characterized by the following features.

According to a first aspect of the present invention, a voltage measuring means (40) measures an actual discharge voltage of a battery (10) which is chargeable and dischargeable repetitively. A current measuring means (30) measures an actual discharge current of the battery. A discharge amount calculating means (110) obtains a calculative discharge amount of the battery based on the actual discharge current measured by the current measuring means. A discharge voltage determining means (140) determines a calculative discharge voltage corresponding to the calculative discharge amount obtained by the discharge amount calculating means on an initial discharge characteristic curve of the battery. The initial discharge characteristic curve represents an initial relationship between the discharge voltage and the discharge amount of the battery. And, a discharge characteristic estimating means (151) parallel shifts the initial discharge characteristic curve so that the calculative discharge voltage determined by the discharge voltage determining means coincides with the actual discharge voltage measured by the voltage measuring means, thereby obtaining an estimated discharge characteristic curve reflecting the actual discharge voltage and the calculative discharge amount.

Preferably, the residual battery capacity detecting apparatus further comprises a deterioration judging means (160) for judging a deterioration of the battery when the actual discharge voltage obtained by the voltage measuring means and a corresponding discharge amount do not meet with the estimated discharge characteristic curve obtained by the discharge characteristic estimating means. A correcting means (161), responsive to a judgement result of the deterioration judging means, analogously corrects the estimated discharge characteristic curve so as to match the actual discharge voltage and the corresponding discharge amount.

According to a second aspect of the present invention, a voltage measuring means (40) measures an actual discharge voltage of a battery (10) which is chargeable and dischargeable repetitively. A current measuring means (30) measures an actual discharge current of the battery. A discharge amount calculating means (110) obtains a calculative discharge amount of the battery based on the actual discharge current measured by the current measuring means. A discharge voltage determining means (140) determines a calculative discharge voltage corresponding to the calculative discharge amount obtained by the discharge amount calculating means on an initial discharge characteristic curve of the battery. The initial discharge characteristic curve represents an initial relationship between the discharge voltage and the discharge amount of the battery. A discharge characteristic estimating means (151) parallel shifts the initial discharge characteristic curve so that the calculative discharge voltage determined by the discharge voltage determining means coincides with the actual discharge voltage measured by the voltage measuring means, thereby obtaining a discharge characteristic curve of an equivalent battery as an estimated discharge characteristic curve reflecting the actual discharge voltage and the calculative discharge amount. And, a residual capacity calculating means (180) calculates a residual capacity of the battery by integrating the discharge voltage along the estimated discharge characteristic curve until the battery is fully discharged from the calculative discharge amount.

Preferably, the residual battery capacity detecting apparatus further comprises a deterioration judging means (160) for judging a deterioration of the battery when the actual discharge voltage obtained by the voltage measuring means and a corresponding discharge amount do not meet with the estimated discharge characteristic curve obtained by the discharge characteristic estimating means. And, a deterioration discharge characteristic estimating means (161), responsive to a judgement of the deterioration judging means, analogously modifies the estimated discharge characteristic curve so as to obtain the discharge characteristic curve of the equivalent battery, as an estimated discharge characteristic curve matching to the actual discharge voltage and the corresponding discharge amount of the deteriorated battery.

Furthermore, a third aspect of the present invention provides a residual battery capacity measuring method comprising the steps of estimating a discharge characteristic curve representing a relationship between a discharge voltage and a corresponding discharge amount of a battery (10) which is subjected to a memory effect, as a combination of discharge characteristic curves of a plurality of equivalent batteries having different voltages, and calculating a residual capacity of the battery by integrating a discharge voltage along the estimated discharge characteristic curve until the battery is fully discharged.

Reference numerals in parenthesis, added in the above description, show the correspondence to the components disclosed in later-described preferred embodiments of the present invention. Therefore, these numerals are merely used for expediting the understanding to the present invention and not used for narrowly interpreting the scope of the present invention.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

The inventors of the present invention have conducted the following research based on a Ni—MH battery having a rated capacity of 100 (Ah).

Figure 11A:
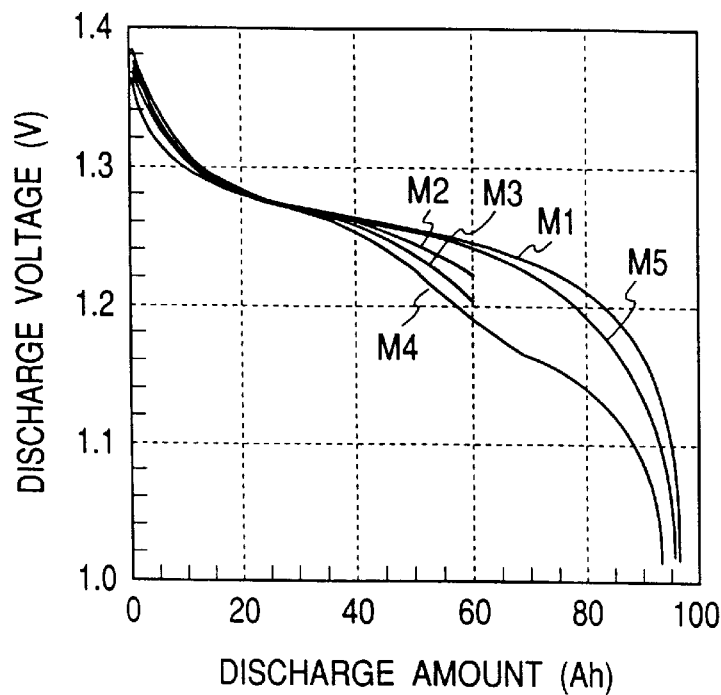
FIG. 11A is a graph showing a relationship between the discharge voltage of the Ni—MH battery and a corresponding discharge amount during a repetitive discharge operation with a discharge amount of 60 Ah.

First of all, various experiments have been done to check the influence given to the discharge characteristics by the presence of memory effect as well as the repetition of charge/discharge operations. FIG. 11A is a graph showing discharge characteristic curves of the Ni—MH battery obtained through their test. A curve M1, representing a relationship between the discharge voltage and a corresponding discharge amount, is an initial discharge characteristic curve of the Ni—MH battery corresponding to a complete discharging, which is obtained when the Ni—MH battery is thoroughly discharged from its full charge capacity to its terminal discharge voltage 1.0 (V).

A curve M2 is another discharge characteristic curve representing a relationship between the discharge voltage and a corresponding discharge amount, obtained when the Ni—MH battery is repetitively discharged ten times in a partial discharge region ranging from its full charge capacity to a discharge amount of 60 Ah.

A curve M3 is another discharge characteristic curve representing a relationship between the discharge voltage and a corresponding discharge amount, obtained when the Ni—MH battery is repetitively discharged twenty times in the same discharge region ranging from its full charge capacity to the discharge amount of 60 Ah.

A curve M4 is another discharge characteristic curve representing a relationship between the discharge voltage and a corresponding discharge amount, obtained when the Ni—MH battery is repetitively discharged twenty-nine times in the same discharge region ranging from its full charge capacity to the discharge amount of 60 Ah and then, in the thirtieth discharge operation, is thoroughly discharged from its full charge capacity to its terminal discharge voltage 1.0 (V).

A curve M5 is another discharge characteristic curve representing a relationship between the discharge voltage and a corresponding discharge amount, obtained when the Ni—MH battery is once more thoroughly discharged from its full charge capacity to its terminal discharge voltage 1.0 (V) after the above-described thirtieth discharge operation.

FIG. 11A apparently shows the influence of the memory effect of the Ni—MH battery. More specifically, curves M2 through M4 correspond to the cases where the Ni—MH battery performs the repetitive charge/discharge operations so that the discharge operation is stopped at an intermediate level equivalent to the discharge amount of 60 Ah and then the battery is recharged to the full charge capacity. When such incomplete charge/discharge operations are repeated, the discharge voltage (of curves M2 through M4) tends to decrease compared with a corresponding value of the initial discharge characteristic curve M1.

Furthermore, it is also apparent from the comparison between the curves M1 and M5 that the discharge characteristics substantially restores to the initial condition when the complete discharge operation (from the full charge condition to the terminal discharge voltage) is performed continuously, at least two consecutive times, even immediately after the above-described incomplete charge/discharge operations of 60 Ah have been performed. In other words, the voltage reduction or declination of the Ni—MH battery is temporary, rather than permanent. Thus, the memory effect of the Ni—MH battery is a temporary phenomenon appearing when the Ni—MH battery repeats the incomplete charge/discharge operations.

Figure 11B:
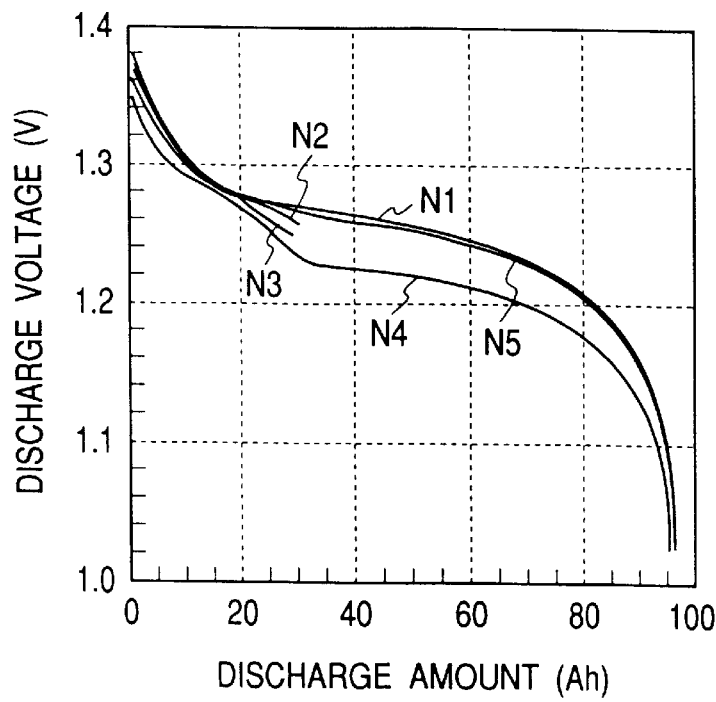
FIG. 11B is a graph showing a relationship between the discharge voltage of the Ni—MH battery and a corresponding discharge amount during a repetitive discharge operation with a discharge amount of 30 Ah.

Secondly, other experiments have been done to check the influence given to the discharge characteristics by the presence of memory effect and the repetition of charge/discharge operations by changing the interruption level of the discharge amount from 60 Ah to 30 Ah. FIG. 11B is a graph showing various discharge characteristic curves of the Ni—MH battery obtained through the test. A curve N1 is identical with the curve M1 of FIG. 11A. Namely, the curve N1, representing a relationship between the discharge voltage and a corresponding discharge amount, is the initial discharge characteristic curve of the Ni—MH battery corresponding to a complete discharging, which is obtained when the Ni—MH battery is thoroughly discharged from its full charge capacity to its terminal discharge voltage 1.0 (V).

A curve N2 is another discharge characteristic curve representing a relationship between the discharge voltage and a corresponding discharge amount, obtained when the Ni—MH battery is repetitively discharged ten times in a partial discharge region ranging from its full charge capacity to a discharge amount of 30 Ah.

A curve N3 is another discharge characteristic curve representing a relationship between the discharge voltage and a corresponding discharge amount, obtained when the Ni—MH battery is repetitively discharged twenty times in the same discharge region ranging from its full charge capacity to the discharge amount of 30 Ah.

A curve N4 is another discharge characteristic curve representing a relationship between the discharge voltage and a corresponding discharge amount, obtained when the Ni—MH battery is repetitively discharged twenty-nine times in the same discharge region from its full charge capacity to the discharge amount of 30 Ah and then, in the thirtieth discharge operation, is thoroughly discharged from its full charge capacity to its terminal discharge voltage 1.0 (V).

A curve N5 is another discharge characteristic curve representing a relationship between the discharge voltage and a corresponding discharge amount, obtained when the Ni—MH battery is once more thoroughly discharged from its full charge capacity to its terminal discharge voltage 1.0 (V) after the above-described thirtieth discharge operation.

Like the graph of FIG. 11A, the graph of FIG. 11B apparently shows the influence of the memory effect of the Ni—MH battery. More specifically, curves N2 through N4 correspond to the cases where the Ni—MH battery performs the repetitive charge/discharge operations so that the discharge operation is stopped at an intermediate level equivalent to the discharge amount of 30 Ah and then the battery is recharged to the full charge capacity. When such incomplete charge/discharge operations are repeated, the discharge voltage (of curves N2 through N4) tends to decrease compared with a corresponding value of the initial discharge characteristic curve N1 even when the interrupt discharge amount is changed from 60 Ah to 30 Ah.

Furthermore, it is also apparent from the comparison between the curves N1 and N5 that the discharge characteristics substantially restores to the initial condition when the complete discharge operation is performed continuously, at least two consecutive times, even immediately after the above-described incomplete charge/discharge operations of 30 Ah have been performed.

Thirdly, according to the experimental data of FIGS. 11A and 11B, the discharge characteristic curves of the Ni—MH battery are respectively similar or analogous.

Accordingly, it is assumed that, when a battery is subjected to any memory effect, its momentary discharge characteristic curve can be estimated by simply shifting its initial discharge characteristic curve by an amount equivalent to a discharge voltage reduction amount caused due to the memory effect. Next, properness of this assumption will be demonstrated by using an equivalent battery circuit shown in FIG. 12.

Figure 12:
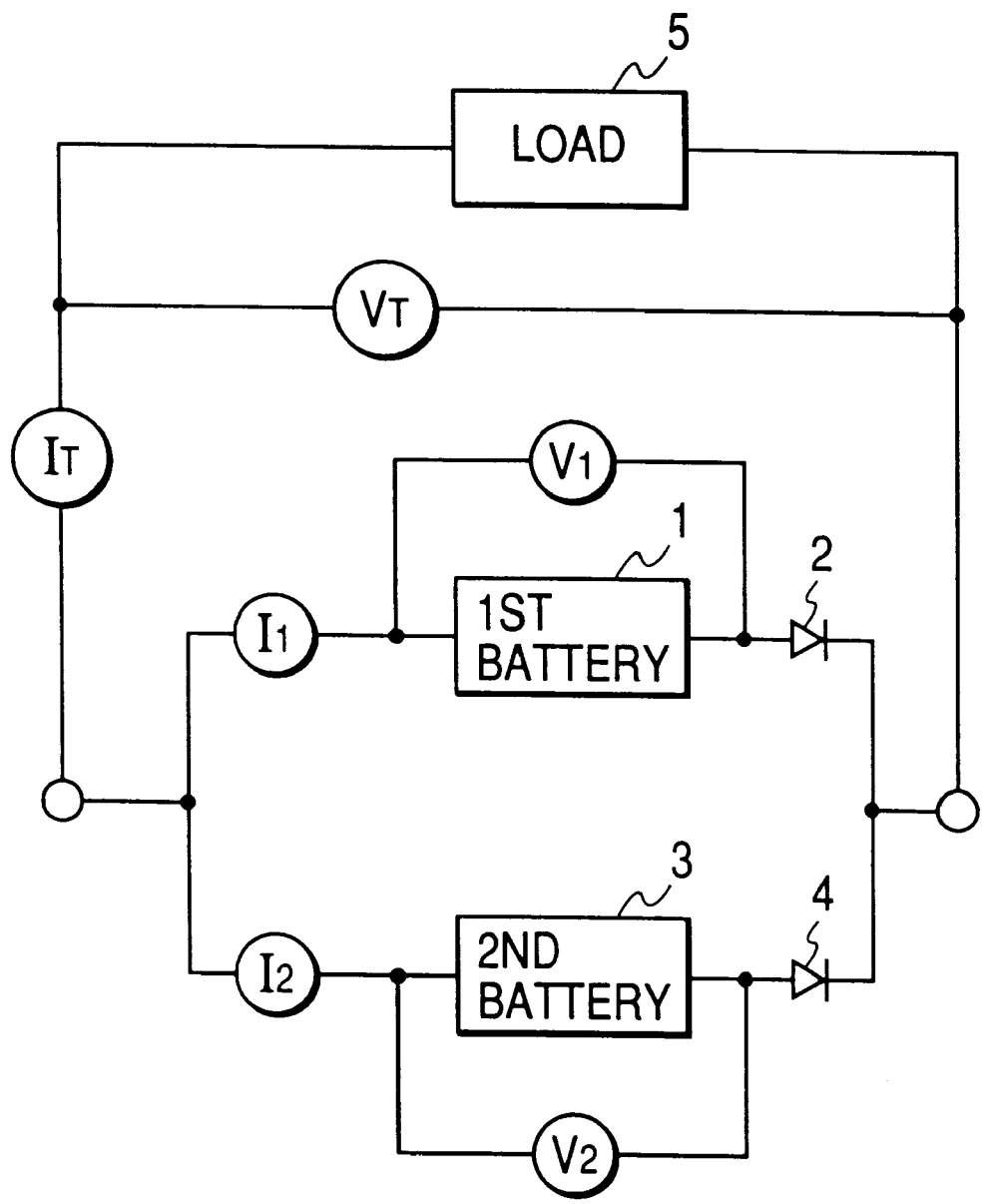
FIG. 12 is a diagram showing an equivalent battery circuit used for demonstrating the discharge characteristics shown in FIGS. 11A and 11B.

The equivalent battery circuit comprises a serial circuit consisting of a first Ni—MH battery 1 and a diode 2 allowing current to flow in only one direction, and another serial circuit consisting of a second Ni—MH battery 3 and a diode 4 allowing current to flow in only one direction. These serial circuits are connected in parallel to each other. A load 5 is connected between both terminals of these serial circuits. In FIG. 12, $I_1$, $I_2$ and $I_T$ represent ammeters, respectively. $V_1$, $V_2$ and $V_T$ represent voltmeters, respectively.

Figure 13A:
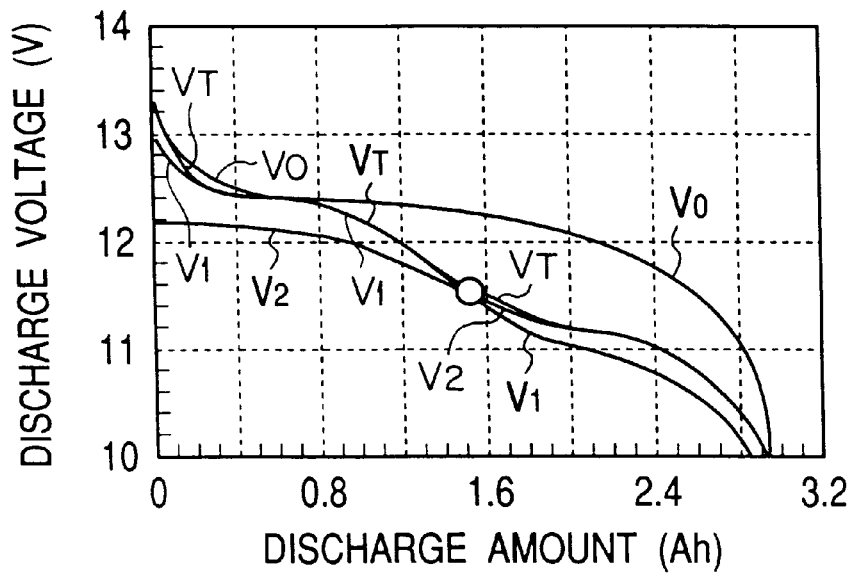
FIG. 13A is a graph showing a relationship between a discharge voltage and a corresponding discharge amount in the equivalent battery circuit shown in FIG. 12.

First, the terminal voltage across each of the Ni—MH batteries 1 and 3 is set to 12V to check the initial discharge characteristics of the Ni—MH batteries 1 and 3 representing a relationship between its discharge voltage and a corresponding discharge amount. In FIG. 13A, a curve Vo is an obtained initial discharge characteristic curve. Each Ni—MH battery 1 or 3 consists of a total of ten battery units connected in series, each battery unit being 1.2 (V) with 1.6 (Ah).

Next, the number of battery units consisting of the second Ni—MH battery 3 is reduced by one, so that the terminal voltage of the first Ni—MH battery 1 becomes higher than that of the second Ni—MH battery 3.

Figure 13B:
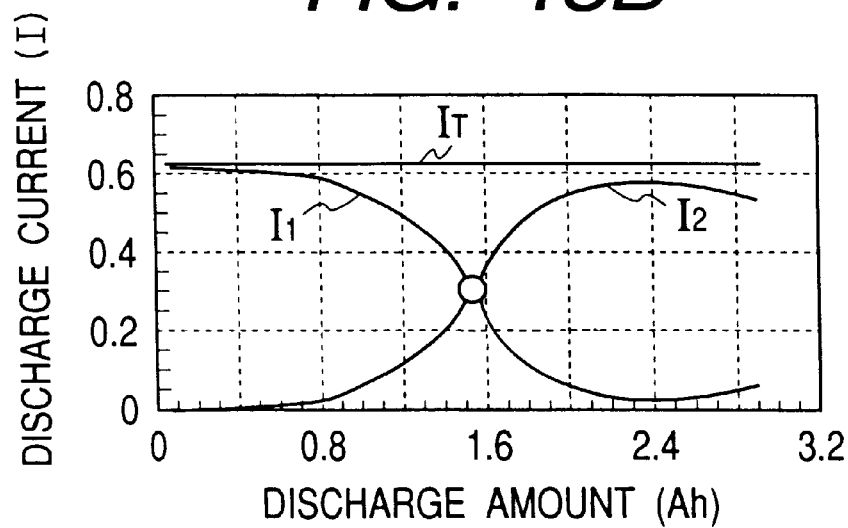
FIG. 13B is a graph showing a relationship between a discharge current and a corresponding discharge amount in the equivalent battery circuit shown in FIG. 12.

FIGS. 13A and 13B show measured discharge voltages and discharge currents in relation to a corresponding discharge amount based on voltage and current data measured by the voltmeters $V_1$, $V_2$ and $V_T$ and ammeters $I_1$, $I_2$ and $I_T$. In FIG. 13A, curves $V_1$, $V_2$ and $V_T$ represent the discharge voltages measured by the voltmeters $V_1$, $V_2$ and $V_T$ in relation to the corresponding discharge amount. In FIG. 13B, curves $I_1$, $I_2$ and $I_T$ represent the discharge current measured by the ammeters $I_1$, $I_2$ and $I_T$ in relation to the corresponding discharge amount.

As apparent from FIG. 13B, the discharge current $I_1$ is large and the other discharge current $I_2$ is small in the first half of the discharge operation. In other words, the first Ni—MH battery 1, having a higher terminal voltage, chiefly performs the discharge operation in the first half of the discharge operation.

The relationship between the discharge currents $I_1$ and $I_2$, in magnitude, is reversed on the halfway of the discharge operation. This is believed because the residual capacity of the first Ni—MH battery 1 is significantly reduced, so the second Ni—MH battery 3 starts discharging chiefly in exchange for the first Ni—MH battery 1.

The curve $V_T$ represents the total discharge voltage, which substantially coincides with the discharge voltage $V_1$ of the first Ni—MH battery 1 in the first half of the discharge operation then substantially coincides with the discharge voltage $V_2$ of the second Ni—MH battery 3 in the second half of the discharge operation.

The discharge voltage, resultant in this manner by switching the first Ni—MH battery 1 to the second Ni—MH battery 3, is lower than a corresponding value of the initial discharge characteristic curve $V_0$ especially in the second half of the discharge operation. The relationship shown in FIG. 13A is very similar to the relationship between the curves M1 and M4. The curve M1 represents the initial discharge characteristic curve, while the curve M4 represents the discharge characteristic curve M4 obtained after the battery is subjected to the memory effect.

In view of the foregoing description, the inventors of the present invention found the mechanism of the memory effect. According to the inventors, the memory effect is the result of uneven discharge operation between a plurality of batteries performed in a changeover or takeover fashion. More specifically, among a plurality of batteries, one battery may have a terminal voltage lowered locally. In such a condition, the substantial discharge operation is switched from a higher-voltage battery to the lower-voltage battery.

Figure 14:
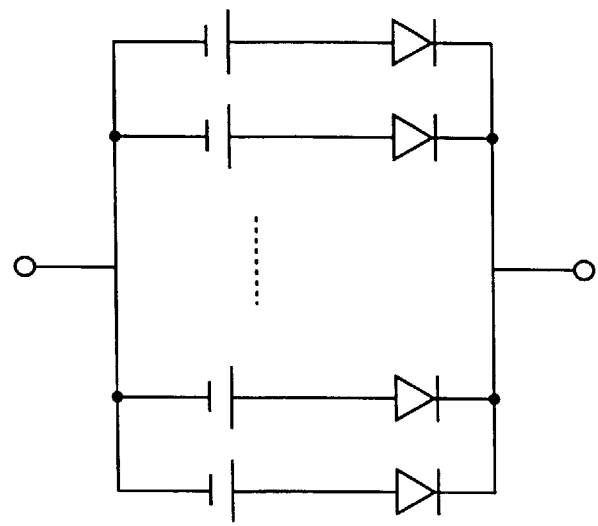
FIG. 14 is a diagram showing a generalized equivalent battery circuit used for explaining the discharge characteristics by taking a memory effect of the Ni—MH battery into consideration.

In this respect, using a circuit model shown in FIG. 14 comprising a plurality of parallel batteries having different terminal voltages, the inventors of the present invention have succeeded to estimate the reduction of a discharge voltage in the discharge characteristics of a battery to demonstrate the above-described assumption. As a result, the discharge voltage in the discharge characteristics is uniformly lowered compared with a corresponding value of the initial discharge characteristics when the battery is subjected to the memory effect. The inventors have then reached the conclusion that the discharge characteristic of a Ni—MH battery, when subjected to the memory effect, can be estimated based on its initial discharge characteristics, in the following manner.

Figure 15:
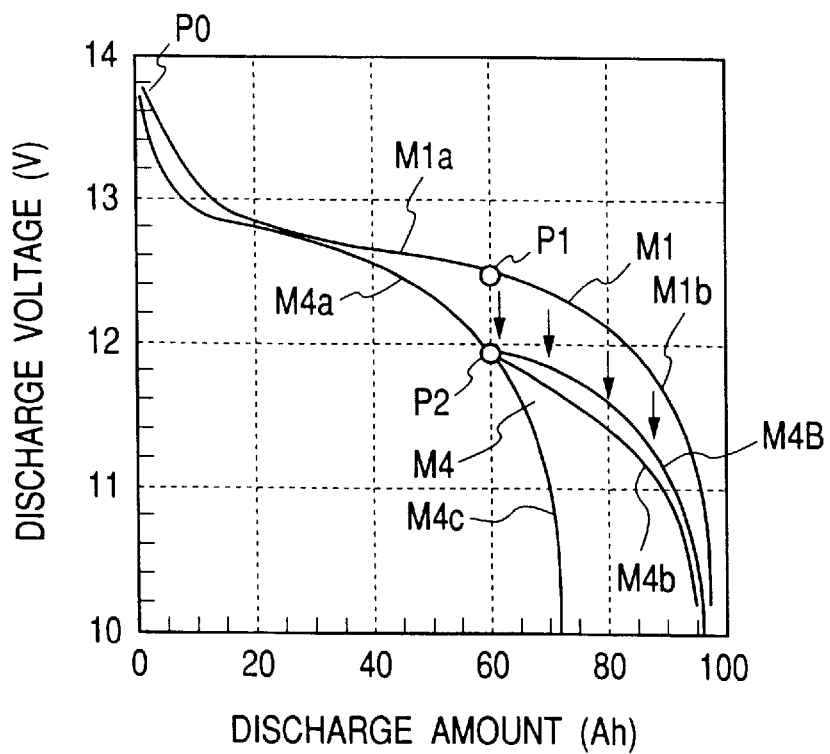
FIG. 15 is a graph explaining an estimation of the discharge characteristics in a non-discharged region of the Ni—MH battery, based on the graph shown in FIG. 11A.

In FIG. 15, the curve M1 is separated into a partial curve M1a and another partial curve M1b connected at a boundary point P1 corresponding to the discharge amount of 60 Ah. In the same manner, the curve M4 is separated into a partial curve M4a and another partial curve M4b connected at a boundary point P2 corresponding to the discharge amount of 60 Ah.

A discharge voltage difference between the points P1 and P2 is dependent on the degree of the actual memory effect.

To estimate a discharge characteristic curve in a non-discharged region succeeding the point P2 (corresponding to the discharge amount exceeding 60 Ah), the inventors propose a simple method that uses a parallel shifting of the curve M1b (i.e., latter part of the initial discharge characteristic curve M1). More specifically, the curve M1b is shifted downward along the ordinate of the graph shown in FIG. 15 by an amount equivalent to a discharge voltage difference between the points P1 and P2. Thus, a curve M4B is created as an estimated discharge characteristic curve resembling the actual discharge characteristic curve M4b. As apparent from FIG. 15, the estimated discharge characteristic curve M4B is substantially identical with the actual discharge characteristic curve M4b.

Then, an entire discharge characteristic curve is obtained by connecting the curve M4a (i.e., former part of the actual discharge characteristic curve M4) and the estimated discharge characteristic curve M4B at the point P2. A curve M4c represents a discharge characteristic curve for the non-discharged region exceeding the discharge amount of 60 Ah which is obtained by replacing the discharge characteristics of the curve M4a with the discharge characteristics of a higher-voltage battery.

The above-described assumption is feasible irrespective of the change of the separating point from 60 Ah to 30 Ah (refer to FIG. 11B) or to any other discharge amount.

Next, the inventors of the present invention studied a method of estimating the discharge characteristics obtained when the discharge amount varies with respect to the full charge condition of the Ni—MH battery.

First, the following is a case where the discharge amount varies in a direction approaching to the full charge condition.

Figure 16A:
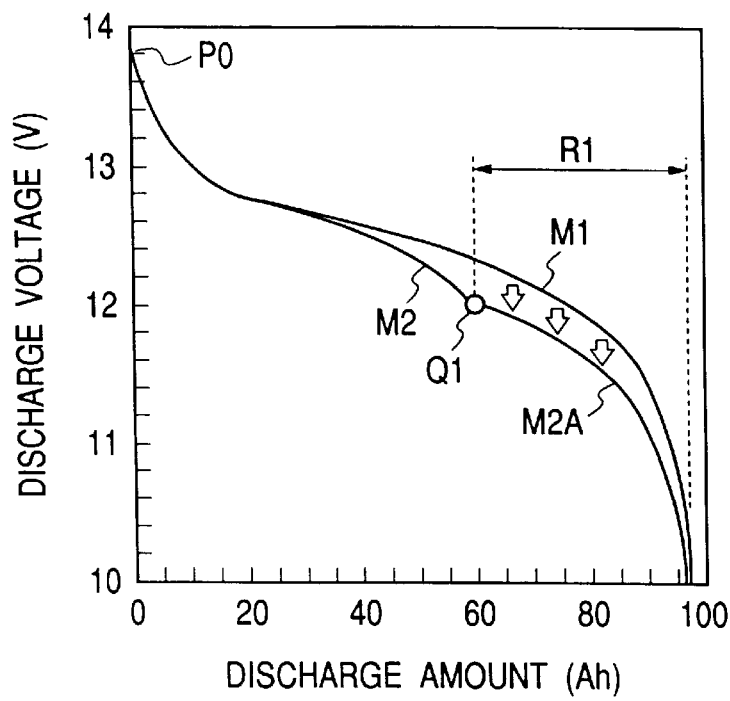
FIGS. 16A and 16B are graphs explaining the estimation of the discharge characteristics in a non-discharged region of the Ni—MH battery when the discharge amount varies in a direction approaching to a full charge condition, based on the graph shown in FIG. 11A.

In FIG. 16A, a point Q1 represents the discharge voltage corresponding to the discharge amount of 60 Ah on the discharge characteristic curve M2 (refer to FIG. 11A). Based on the above-described estimation method using a parallel shifting, an estimated discharge characteristic curve M2A is obtained in a non-discharged region R1 succeeding the point Q1.

Figure 16B:
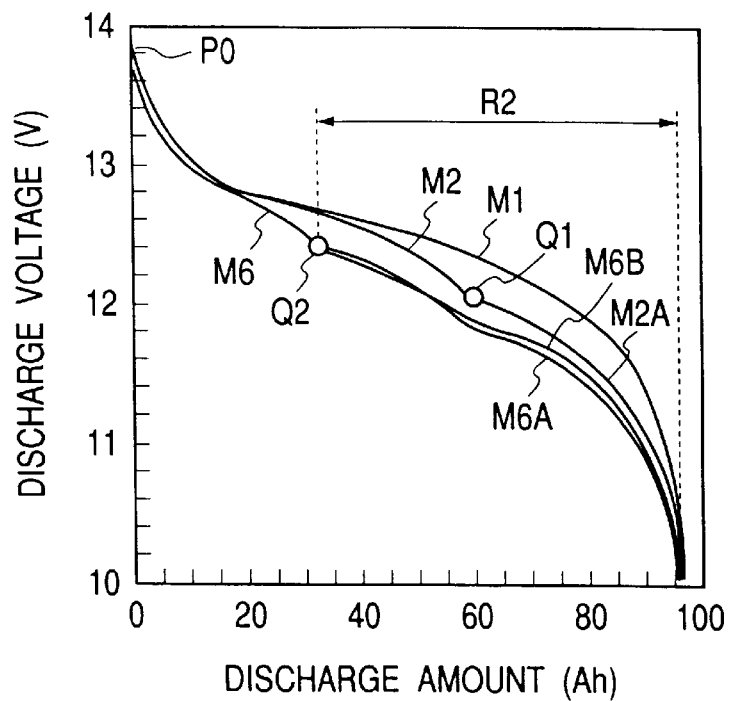

Next, after the Ni—MH battery is discharged along the curve M2 until the discharge amount reaches the point Q1, the Ni—MH battery is recharged to the full charge condition. Thereafter, the incomplete discharge operation is repeated ten times with a discharge amount of 30 Ah in each cycle. In FIG. 16B, a curve M6 represents a discharge characteristic curve obtained as a result of the above-described ten charge/discharge operations. A point Q2 on the discharge characteristic curve M6 represents a discharge voltage corresponding to the discharge amount of 30 Ah. A curve M6B is an estimated discharge characteristic curve in a non-discharged region R2 following the point Q2, estimated by using the above-described estimation method. The estimated discharge characteristic curve M6B is connected to the actual characteristic curve M6 at the point Q2 of 30 Ah.

A curve M6A represents an actual discharge characteristic curve, which is obtained when the Ni—MH battery is actually discharged in the non-discharged region R2 from the point Q2 based on the discharge characteristic curve M6. As apparent from FIG. 16B, the estimated discharge characteristic curve M6B is substantially identical with the actual discharge characteristic curve M6A. Needless to say, this demonstrates the properness of the above-described assumption.

Second, the following is another case where the discharge amount varies in a direction departing from the full charge condition.

Figure 17A:
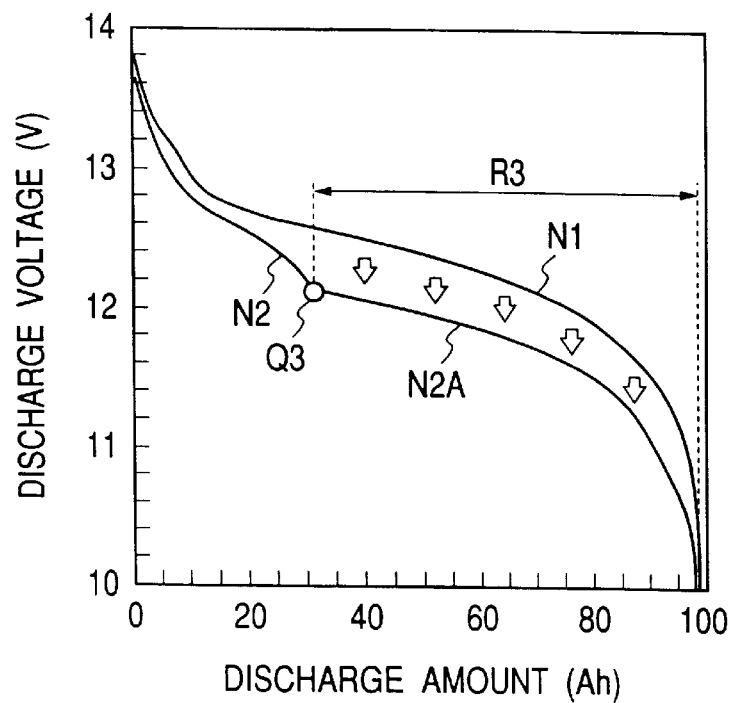
FIGS. 17A and 17B are graphs explaining the estimation of the discharge characteristics in a non-discharged region of the Ni—MH battery when the discharge amount varies in a direction departing from the full charge condition, based on the graph shown in FIG. 11B.

In FIG. 17A, a point Q3 represents the discharge voltage corresponding to the discharge amount of 30 Ah on the discharge characteristic curve N2 (refer to FIG. 11B). Based on the above-described estimation method using a parallel shifting, an estimated discharge characteristic curve N2A is obtained in a non-discharged region R3 succeeding the point Q3.

Figure 17B:
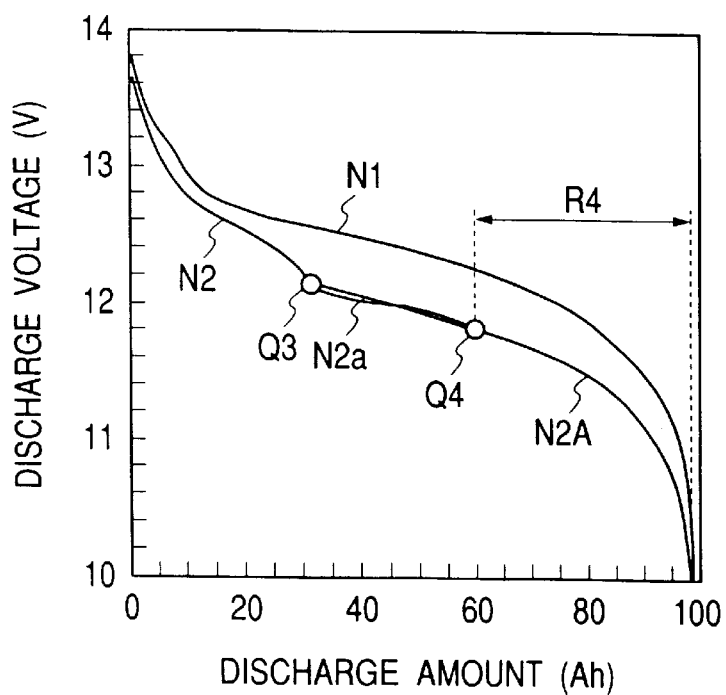

Next, after the Ni—MH battery is discharged along the curve N2 until the discharge amount reaches the point Q3, the Ni—MH battery is further discharged continuously until the discharge amount reaches a point Q4 corresponding to 60 Ah, as shown in FIG. 17B. A curve N2a represents a discharge characteristic curve of the Ni—MH battery actually measured during the actual discharge operation from the point Q3 to the point Q4. As apparent from FIG. 17B, the estimated discharge characteristic curve N2A is substantial identical with the actual discharge characteristic curve N2a.

Figure 18A:
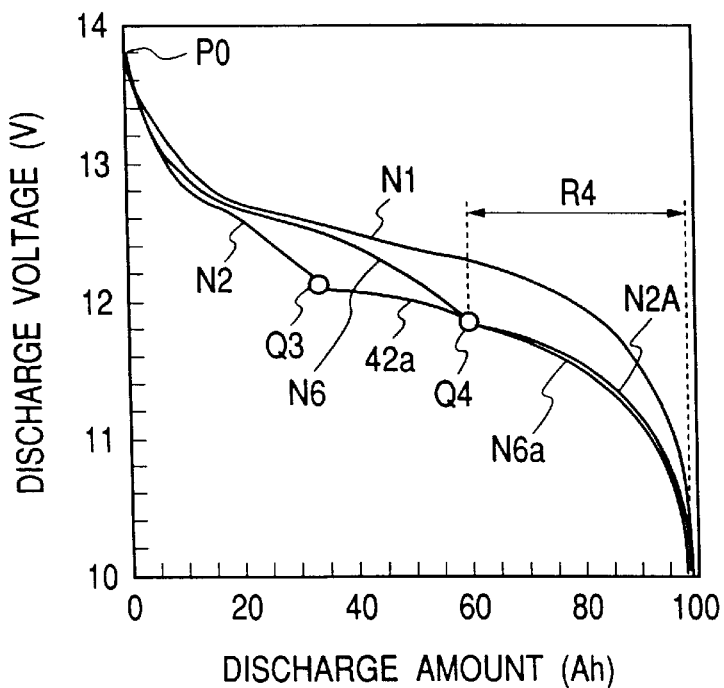
FIGS. 18A and 18B are graphs explaining the estimation of the discharge characteristics in a non-discharged region of the Ni—MH battery when the discharge amount varies in a direction departing from the full charge condition, based on the graph shown in FIG. 11B.

Next, in FIG. 18A, a curve N6 represents an estimated discharge characteristic curve whose voltage level is increased after the Ni—MH battery is recharged from the point Q4 to the full charge condition. In other words, once the battery is discharged, the capacity of a higher-voltage battery is switched from 30 Ah to 60 Ah. Hence, as previously explained with reference to FIG. 15, the discharge characteristic curve N6 can be estimated by analogously or similarly modifying the initial discharge characteristic curve Ni so as to start from a point Q0 and pass the point Q4.

Figure 18B:
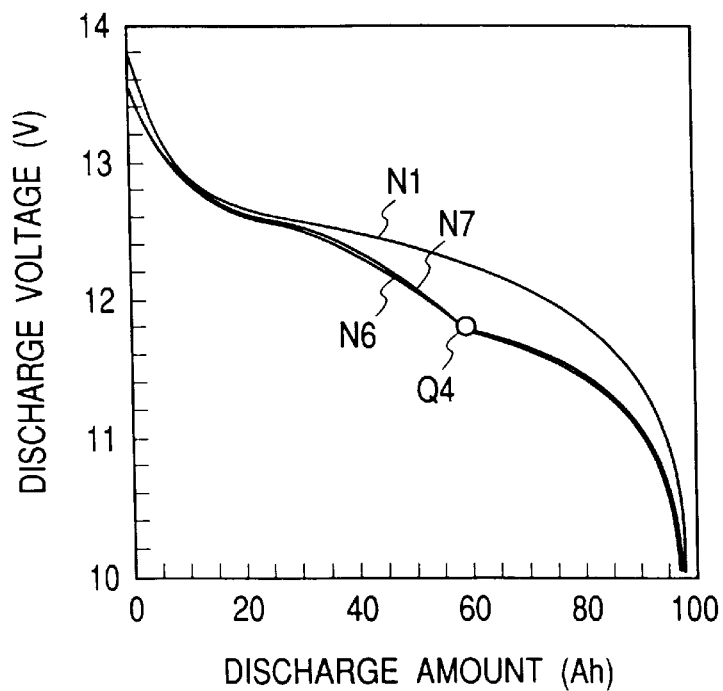

As shown in FIG. 18B, the estimated discharge characteristic curve N6 substantially coincides with an actual discharge characteristic curve N7 measured after the Ni—MH battery is fully charged.

The discharge characteristics of the Ni—MH battery momentarily varies due to progress of the memory effect occurring during a discharge operation of the Ni—MH battery. Nevertheless, as explained in the foregoing description, the inventors of the present invention succeeded to accurately estimate such an interim discharge characteristic curve in a non-discharged region which is necessary to calculate the residual capacity of a concerned battery.

Next, the inventors of the present invention studied the influence given to the discharge characteristics by deterioration of the Ni—MH battery.

Figure 19A:
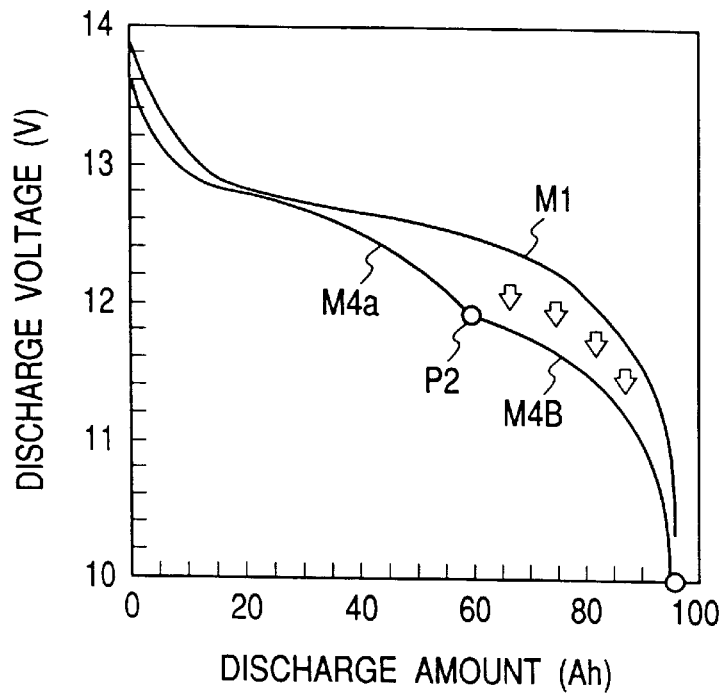
FIGS. 19A and 19B are graphs explaining the estimation of the discharge characteristics in a non-discharged region of the Ni—MH battery when the battery is deteriorated, based on the graph shown in FIG. 11A.
Figure 19B:
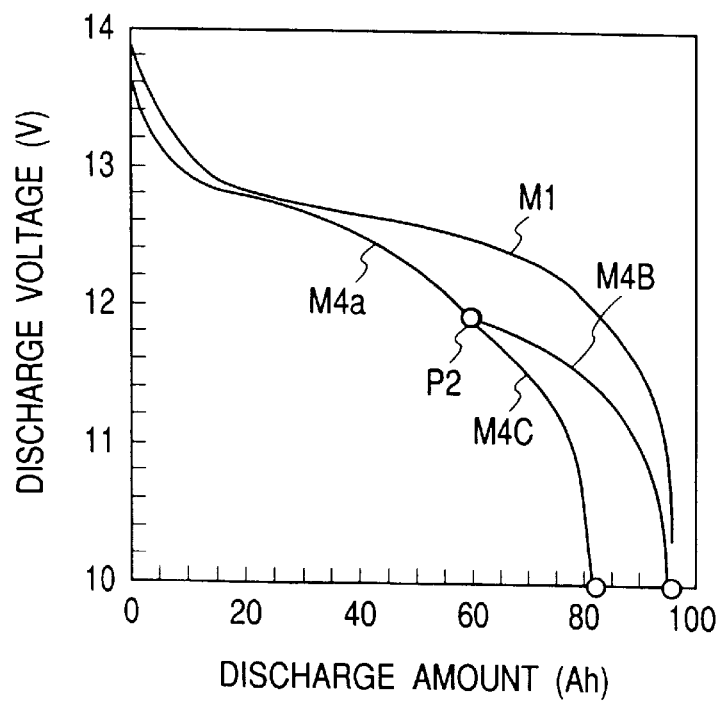

FIG. 19A shows the curves M1, M4a and M4B selectively extracted from FIG. 15. Meanwhile, FIG. 19B shows an additional curve M4C representing the discharge characteristics of a deteriorated Ni—MH battery. When the Ni—MH battery is significantly deteriorated compared with its initial discharge characteristic curve M1, the deteriorated Ni—MH battery continues discharging from the point P2 along the curve M4C. As apparent from the comparison between FIGS. 19A and 19B, the deteriorated discharge characteristic curve M4C largely differs from the estimated discharge characteristic curve M4B.

The resultant difference between the curves M4C and M4B is apparent from the fact the deterioration of the battery is not taken into consideration in the estimation of the discharge characteristic curve M4B.

However, the inventors of the present invention propose to positively utilize such a difference in a detection of the deterioration caused in a concerned Ni—MH battery.

Figure 20:
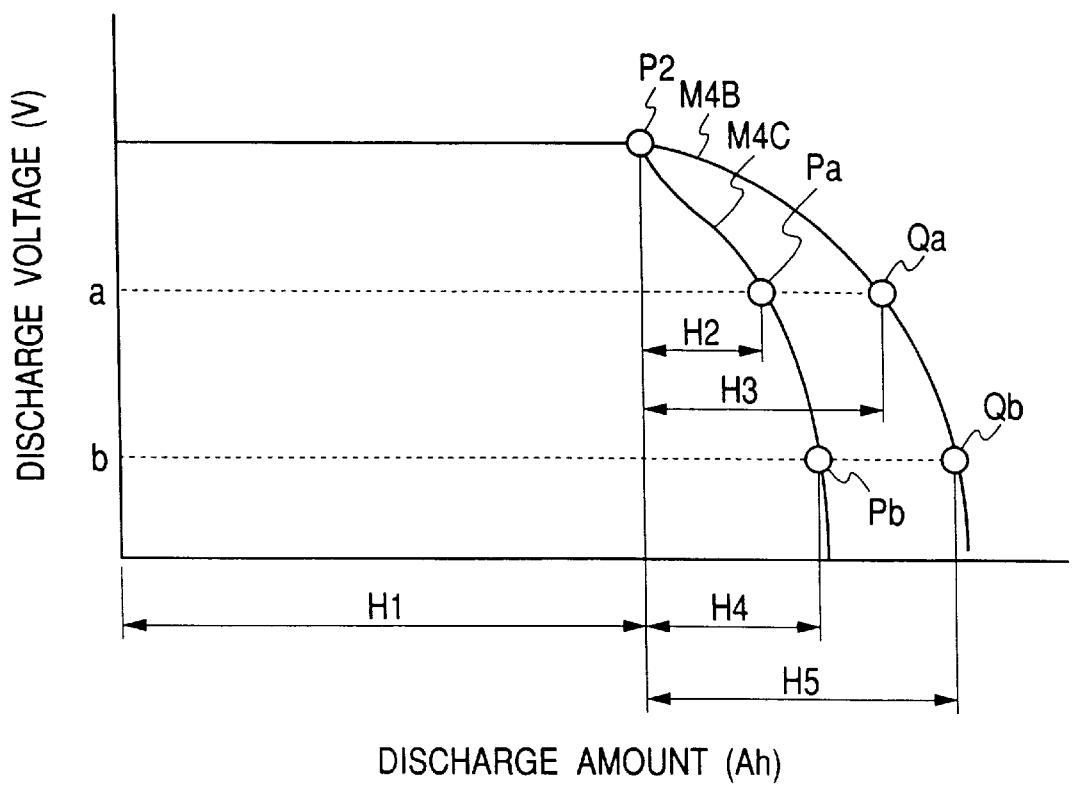
FIG. 20 is an enlarged view showing part of FIG. 19B.

FIG. 20 is an enlarged view showing an essential part of FIG. 19B, in which points Pa and Qa represent discharge amounts corresponding to a discharge voltage "a" on the curves M4C and M4B, while points Pb and Qb represent discharge amounts corresponding to a discharge voltage "b" on the curves M4C and M4B.

A discharge amount at the point Pa on the discharge characteristic curve M4C is a sum of a discharge amount H1 at the point P2 and a discharge amount H2 between the points P2 and Pa.

A discharge amount at the point Qa on the discharge characteristic curve M4B is a sum of the discharge amount H1 at the point P2 and a discharge amount H3 between the points P2 and Qa. In configuration, the curves M4B and M4C are similar to each other. Thus, the following equation is established.

$$H2/H3 = H4/H5 \qquad (1)$$

where H4 represents a discharge amount between the point P2 and Pb, while H5 represents a discharge amount between the point P2 and Qb.

Both the discharge voltage and the discharge amount are measurable at respective points Pa and Qa. In other words, the value of the left side of the equation (1) can be obtained from the measured data.

Thus, it becomes possible to calculate the discharge characteristic of the deteriorated battery by converting the discharge amount H5 (at the point Qb on the estimated discharge characteristic curve M4B) into the discharge amount H4 according to the equation (1).

Preferred embodiments of the present invention will be explained hereinafter with reference to accompanied drawings. Identical parts are denoted by the same reference numerals throughout the drawings.

First Embodiment

Figure 1:
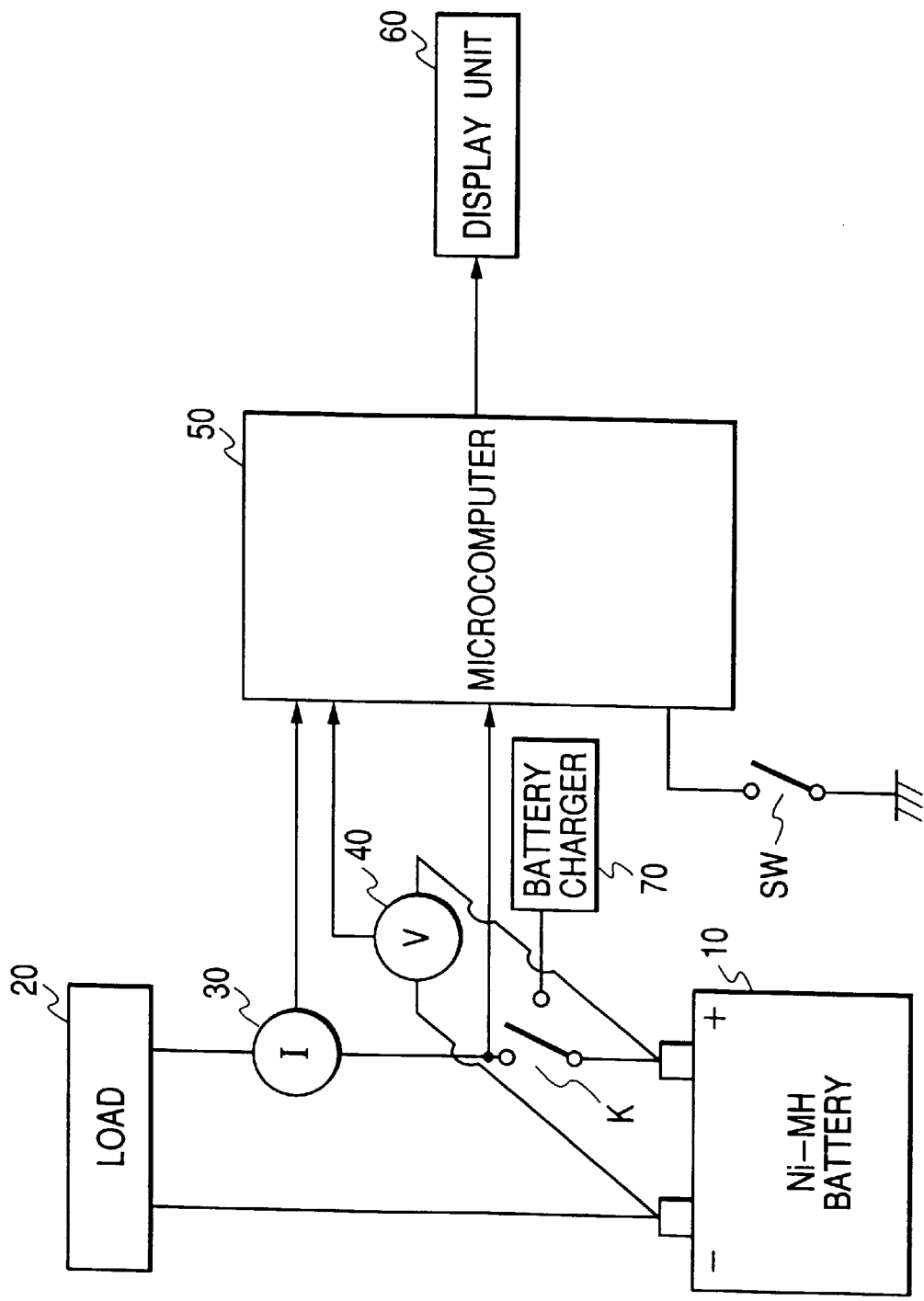
FIG. 1 is a block diagram showing an arrangement of a residual capacity detecting apparatus for a battery in accordance with a first embodiment of the present invention.

FIG. 1 is a block diagram showing a schematic arrangement of a residual capacity detecting apparatus for a battery installed on an electric vehicle in accordance with a first embodiment of the present invention.

In FIG. 1, a Ni—MH battery 10 comprises a plurality of (e.g., a total of ten) battery units connected in series. Each Ni—MH battery unit is a secondary battery having a rated capacity of 100 Ah. An electric load 20, such as an electric motor acting as a driving source for an electric automotive vehicle, is connected between the electrode terminals of Ni—MH battery 10.

An ammeter 30 is connected between the Ni—MH battery 10 and the load 20 to measure the current supplied from the Ni—MH battery 10 to the load 20. A voltmeter 40 is connected between the terminal electrodes of the Ni—MH battery 10 to measure the terminal voltage of the Ni—MH battery 10. The current and voltage data measured by the ammeter 30 and the voltmeter 40 are entered into a microcomputer 50.

The microcomputer 50 is associated with an operation switch SW which is operated occasionally when the measured result is stored. Both the load 20 and the microcomputer 50 are connected to the Ni—MH battery 10 via a key switch K. When the key switch K is closed, electric power of the Ni—MH battery 10 is supplied to the load 20 and the microcomputer 50. The Ni—MH battery 10 is charged by a battery charger 70.

Figure 2:
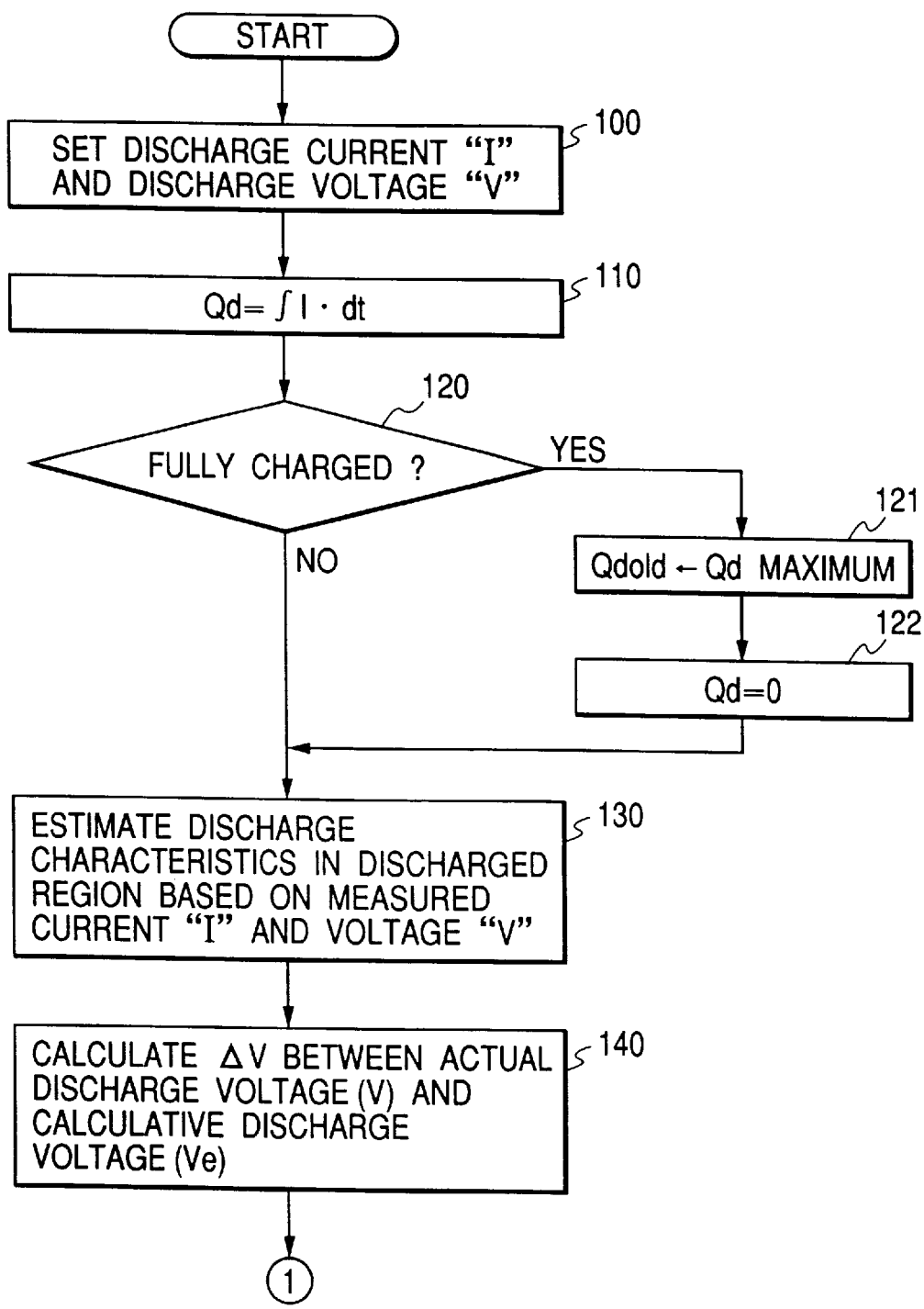
FIG. 2 is the former part of a flowchart of a main control routine executed in a microcomputer shown in FIG. 1 in accordance with the first embodiment of the present invention.
Figure 3:
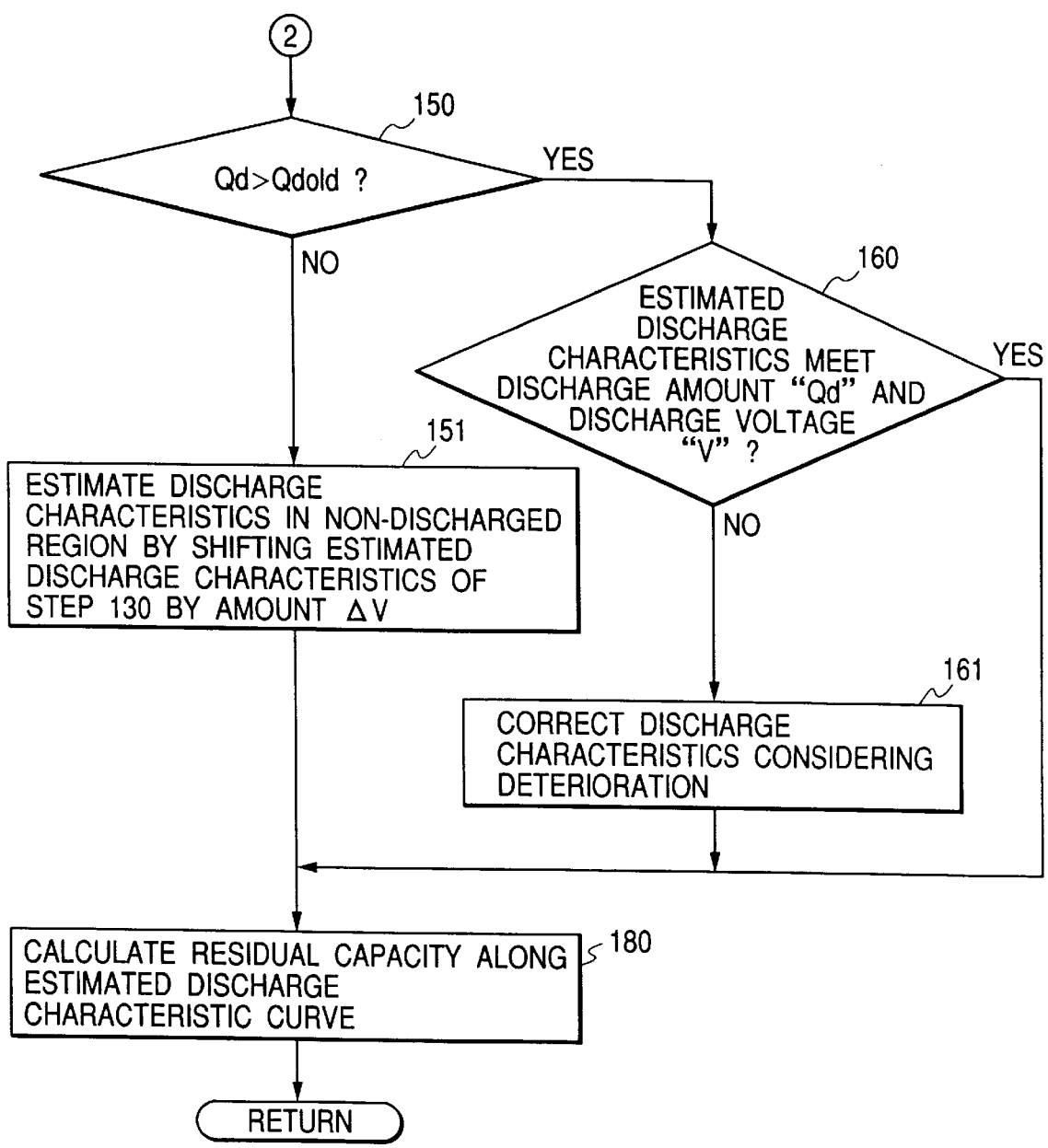
FIG. 3 is the latter part of the flowchart of the main control routine executed in the microcomputer shown in FIG. 1.
Figure 4:
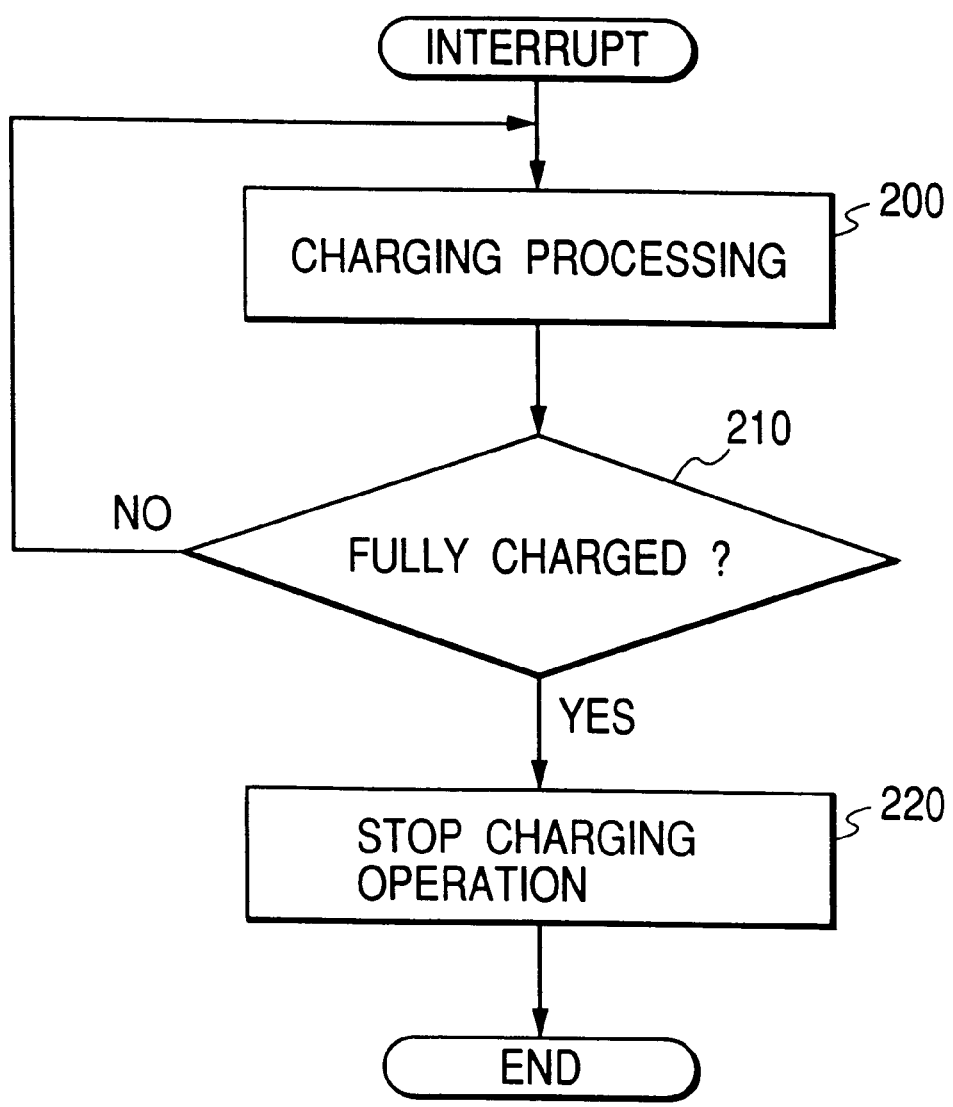
FIG. 4 is a flowchart of an interrupt control routine executed in the microcomputer shown in FIG. 1 in accordance with the first embodiment of the present invention.

FIGS. 2 and 3 cooperatively shows a main control routine executed in the microcomputer 50. FIG. 4 shows an interrupt control routine executed in the microcomputer 50. Through the execution of the main and interrupt control routines, the microcomputer 50 performs various processing including the calculation of the residual capacity of the Ni—MH battery 10 based on the data measured by the ammeter 30 and the voltmeter 40 as well as a display of calculated data using a display unit 60.

The main control routine and the interrupt control routine are stored, as program, in a RAM of the microcomputer 50. The microcomputer 50 converts the terminal voltage of the Ni—MH battery 10 into a constant voltage in response to a closing of the key switch K, and then starts its operation based on the thus adjusted constant voltage. The microcomputer 50 starts the interrupt control routine simultaneously with a charging operation of the Ni—MH battery 10 in response to an opening of the key switch K.

The display unit 60 is provided at an appropriate place, such as an instrument panel, in a passenger compartment of the electric automotive vehicle in a visible condition for letting a driver know the momentary condition of the battery.

In the above-described arrangement of the first embodiment of the present invention, the microcomputer 50 starts its interrupt control routine in accordance with the flowchart shown in FIG. 4 upon the key switch K being connected to the battery charger 70.

In the flowchart shown in FIG. 4, step 200 performs charging processing of the Ni—MH battery 10. Next, step 210 makes a judgement as to whether the Ni—MH battery 10 is fully charged. When the judgement result is "NO" in the step 210, the control flow returns to step 200. The steps 200 and 210 are repetitively performed until the judgement result turns to "YES" in the step 210. When the Ni—MH battery 10 is fully charged (i.e., "YES" in step 210), step 220 stops the charging operation. The above-described interrupt control is executed every time the key switch K is connected to the battery charger 70.

When the key switch K is connected to the load 20, discharge current flows from the Ni—MH battery 10 to the load 20. The ammeter 30 measures the discharge current. The voltmeter 40 measures the discharge voltage of the Ni—MH battery 10.

The microcomputer 50 executes the main control routine according to the flowchart shown in FIGS. 2 and 3.

In step 100, the microcomputer 50 enters the discharge current measured by the ammeter 30 and the discharge voltage measured by the voltmeter 40, and set the measured data as digital data representing the discharge current I and the discharge voltage V of the Ni—MH battery 10. Next, in step 110, the discharge amount Qd is calculated by integrating the discharge current I according to the following equation.

$$Qd = \int I \cdot dt \, (\text{Ah}) \qquad (2)$$

Thereafter, step 120 makes a judgement to check whether the Ni—MH battery 10 is fully charged. When the Ni—MH battery 10 is in a full charge level (i.e., "YES" in step 120), a maximum value of the present discharge amount Qd is set as a previous discharge amount Qdold in step 121. Next, the step 122 resets the discharge amount Qd to zero (i.e., Qd=0). Then, the control flow proceeds to step 130.

On the other hand, when the Ni—MH battery 10 is not in the full charge level (i.e., "NO" in step 120), the control flow directly proceeds to the step 130.

The Ni—MH battery 10 has a tendency that its terminal voltage restores to the original state once the Ni—MH battery 10 is thoroughly discharged and then recharged up to its full charge level. Thus, the discharge characteristics of the Ni—MH battery 10 is shifted to a higher level immediately after the Ni—MH battery 10 is fully charged in this manner. Accordingly, step 130 estimates the present discharge characteristics of the Ni—MH battery 10 by analogously or similarly modifying the initial discharge characteristic curve using the method explained with reference to FIG. 15. More specifically, with a fixed reference point of Qd=0 corresponding to the point P0 shown in FIG. 15, the initial discharge characteristic curve M1 is analogously or similarly modified so as to pass a present position (which corresponds to P2 in FIG. 15) defined by the latest data of the discharge current I and discharge voltage V set at the step 100, thereby obtaining an estimated discharge characteristic curve coinciding with the present discharge condition.

The microcomputer 50 has a ROM storing the data relating to the initial discharge characteristic curve M1 (refer to FIG. 15) of the Ni—MH battery 10 which represents a relationship between the discharge voltage and the discharge current to be obtained when the Ni—MH battery 10 is in the full charge condition without any deterioration.

After finishing the step 130, the control flow proceeds to a step 140 to calculate a difference ΔV between the actual discharge voltage V obtained in the step 100 and an estimated discharge voltage Ve on the estimated discharge characteristic curve obtained in the step 130 (i.e., ΔV=|V−Ve|). The discharge voltage Ve corresponds to the present discharge amount Qd obtained in the step 110.

Next, in step 150 of FIG. 3, a judgement is made to check whether Qd is larger than Qdold (i.e., Qd>Qdold ?). The judgement of step 150 will be explained in more detail with reference to FIG. 5.

Figure 5:
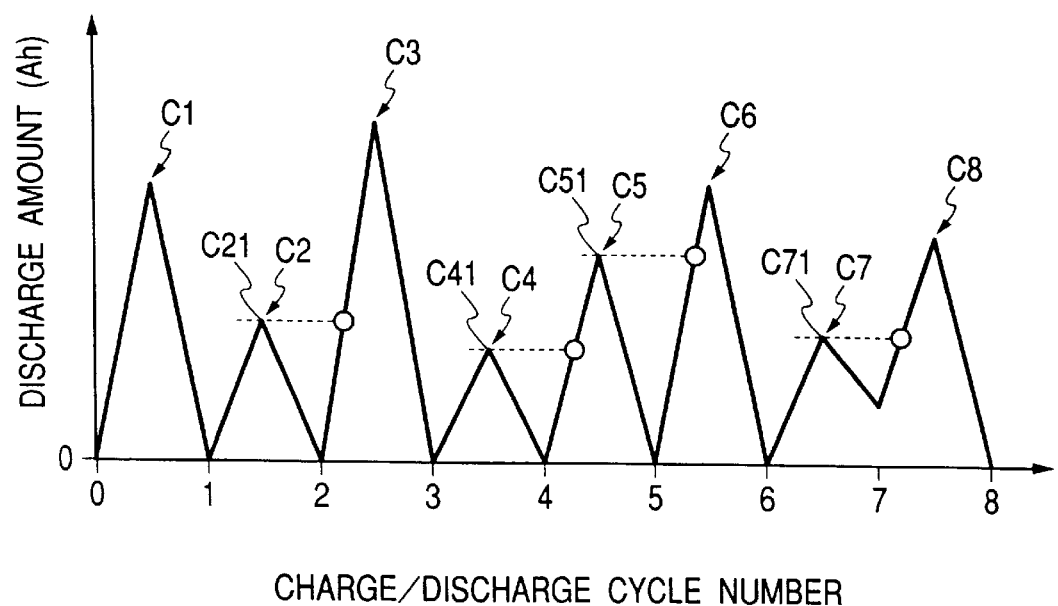
FIG. 5 is a graph showing a variation of the discharge amount of a Ni—MH battery shown in FIG. 1 in relation to a charge/discharge cycle number.

FIG. 5 is a graph showing a relationship between a discharge amount and a charge/discharge cycle number of the Ni—MH battery 10. In the graph, each right ascending line represents a discharging of the Ni—MH battery 10, while each right descending line represents a charging of the Ni—MH battery 10. One charge/discharge cycle of the Ni—MH battery 10 consists of a pair of a right ascending line and a succeeding right descending line. In FIG. 5, C1 through C8 represent #1 through #8 charge/discharge cycles.

According to FIG. 5, in each of the #3, #5, #6 and #8 charge/discharge cycles C3, C5, C6 and C8, the present discharge amount Qd is larger than their previous discharge amount Qdold (C21, C41, C51 and C71, respectively).

When the condition Qd>Qdold is not established (i.e., "NO" in step 150), the control flow proceeds to step 151. In this case, a present voltage difference ΔV cannot be fixed. Thus, in the step 151, a latest discharge characteristic curve of the Ni—MH battery 10 is estimated by parallel shifting the previously estimated discharge characteristic curve (obtained in the step 130) by an amount equivalent to the latest voltage difference ΔV (refer to the step 140). This is an estimation method used when the discharge amount Qd is not larger than the previous discharge amount Ddold, corresponding to the estimation method explained with reference to FIGS. 15, 16A and 16B. This estimation is applied to a non-discharged region of the Ni—MH battery 10.

On the other hand, when the condition Qd>Qdold is established (i.e., "YES" in step 150), the control flow proceeds to step 160. In this case, the present voltage difference ΔV is fixed as a value involving the memory effect. In step 160, a judgement is made to check whether the present discharge amount Qd (refer to the step 110) and the corresponding present discharge voltage V (refer to the step 100) agree with the discharge characteristic curve estimated in the step 151.

When the judgement result is YES in the step 160, it is concluded that the Ni—MH battery 10 has no substantial deterioration. The control flow proceeds to step 180 without performing any correction.

On the other hand, when the judgement result is NO in the step 160, it is confirmed that Ni—MH battery 10 is subjected to substantial deterioration. Hence, the control flow proceeds to a step 161 to correct the estimated discharge characteristic curve obtained in the step 151 considering the actual deterioration of the Ni—MH battery 10 by utilizing the proportional estimation method explained with reference to FIG. 20. As a result, the present embodiment can estimate the discharge characteristic of the Ni—MH battery 10 by considering the memory effect even in a case where the Ni—MH battery 10 is subjected to substantial deterioration, as well as the discharge characteristics free from the deterioration.

Finally, in step 180, the microcomputer 50 calculates a residual capacity of the Ni—MH battery 10 by integrating the discharge voltage along the estimated discharge characteristic curve in the non-discharge region until the Ni—MH battery is fully discharged. Then, the control flow returns to the beginning of the flowchart.

Namely, the discharge characteristic of the Ni—MH battery 10 varies momentarily due to progress of the memory effect occurring during the discharge operation. The first embodiment makes it possible to correctly estimate this kinds of variable discharge characteristics of the Ni—MH battery 10. Accordingly, the residual capacity of the Ni—MH battery 10 can be known accurately and displayed on the display unit 60.

Furthermore, when the deterioration of the Ni—MH battery 10 is found, the estimated discharge characteristics is corrected precisely by analogously or similarly modifying it so as to meet the measured actual voltage and a corresponding actual discharge amount. With this correction, the discharge characteristics of the Ni—MH battery 10 can be accurately obtained even when the Ni—MH battery is subjected to the deterioration.

Second Embodiment

Next, a second embodiment of the present invention will be explained with reference to the flowchart shown in FIGS. 6 and 7.

When Ni—MH battery 10 is used in an electric vehicle, its charge/discharge current or electric power varies frequently. The Ni—MH battery 10 has a discharge voltage decreasing in accordance with a voltage drop proportional to an increased discharge current and the internal resistance of the Ni—MH battery 10. In general, when the Ni—MH battery 10 continues a discharge operation with frequent variations of its current and electric power as seen in many of electric vehicles, the Ni—MH battery 10 has a tendency of rapidly decreasing its discharge voltage due to a sharp increase of the internal resistance of the Ni—MH battery 10 in the final stage of the discharge operation. Accordingly, it becomes impossible to secure the discharge current and the electric power of predetermined levels which should be inherently maintained in the Ni—MH battery 10.

Accordingly, the second embodiment of the present invention defines the residual capacity as an energy remaining or available until the Ni—MH battery 10 reaches a level at which the discharge operation of Ni—MH battery 10 cannot be substantially maintained with the predetermined discharge current and the electric power.

Thus, the second embodiment determines a judging standard for judging the residual capacity of Ni—MH battery 10 in the following manner.

Figure 8:
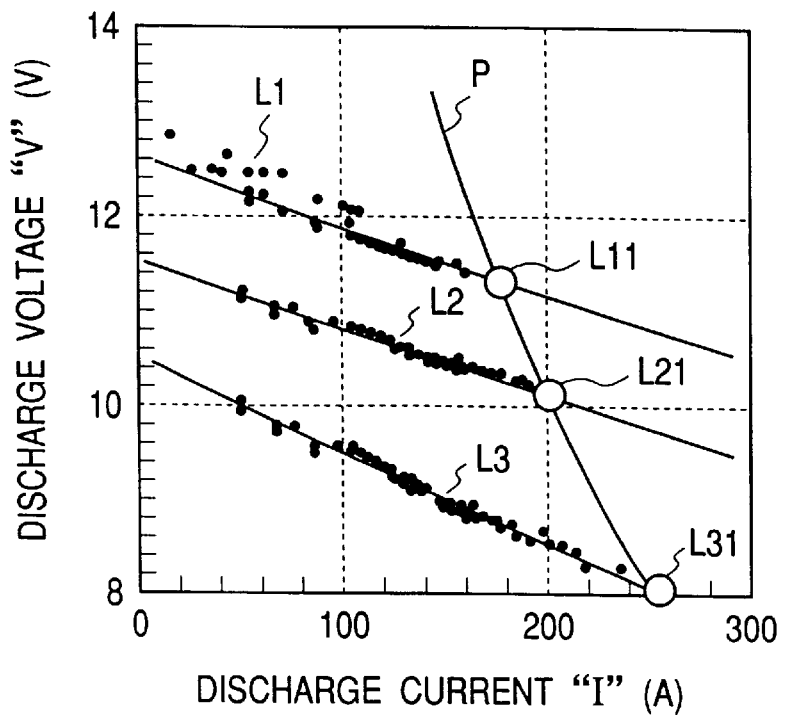
FIG. 8 is a graph showing a relationship between a discharge voltage of the Ni—MH battery and a corresponding discharge current.

FIG. 8 shows a relationship between the discharge voltage V and the discharge current I of the Ni—MH battery 10, obtained when the Ni—MH battery 10 is used in an electric vehicle. A curve L1 represents a relationship corresponding to a 100% residual capacity of the Ni—MH battery 10. A curve L2 represents a relationship corresponding to 50% residual capacity. A curve L3 represents a relationship corresponding to 0% residual capacity. A curve P represents a 2 kW discharge power.

As understood from FIG. 8, regarding the discharge electric power of the Ni—MH battery 10, the maximum values L11, L21 and L31 on respective curves L1, L2 and L3 align along the 2 kW discharge power curve P. Furthermore, when the discharge voltage of the 2 kW discharge power curve P decreases to the point L31 on curve L3, the discharge voltage of the Ni—MH battery 10 decreases abruptly due to large discharge current or large electric power equivalent to 2 kW.

In view of the foregoing, the second embodiment of the present invention defines the residual capacity as being zero (=0) when the discharge voltage is reduced to 8V under the discharge power of 2 kW. Hereinafter, the calculation of the residual capacity will be explained in more detail.

Figure 9:
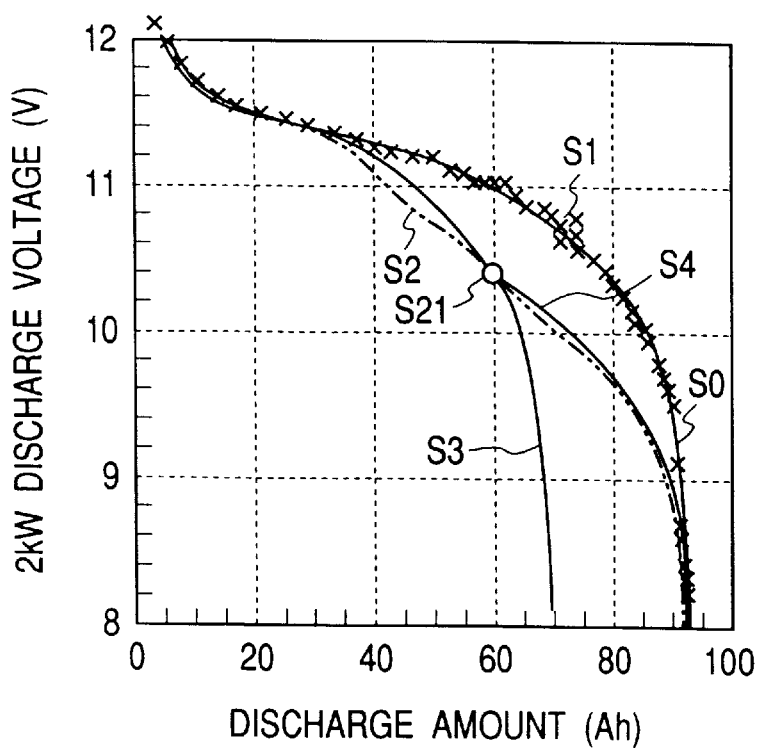
FIG. 9 is a graph showing a relationship between a 2 kW discharge voltage and a corresponding discharge amount based on a curve L1 of FIG. 8.

FIG. 9 is a graph plotting the discharge voltage values in relation to their corresponding discharge amounts during a discharge operation starting from the point L11 (i.e., an intersecting point of curves P and L1 of FIG. 8) and reaching to the point of the residual capacity 0 (Ah).

FIG. 9 shows an initial discharge characteristic curve S0 corresponding to 2 kW discharge power. A curve S1 represents 2 kW discharge characteristics of Ni—MH battery 10 not subjected to the memory effect. A discharge characteristic curve S2 is obtained when the Ni—MH battery 10 is subjected to the memory effect as a result of repetitive discharge cycles of 60 Ah and thereafter is discharged so much that the 2 kW discharge is no longer feasible.

In this case, the discharge characteristics is estimated at the discharge point S21 corresponding to the discharge amount of 60 Ah. The discharge characteristic curve, resultant from this estimation, is represented by a combination of two curves S3 and S4. The curve S3 represents the discharge characteristics of an equivalent battery having a higher voltage, while the curve S4 represents the discharge characteristics of an equivalent battery having a lower voltage.

In this case, the discharge characteristic curve S3 is obtained by analogously or similarly modifying the initial discharge characteristic curve S0 with a fixed reference point corresponding to the discharge amount 0 (Ah). On the other hand, the discharge characteristic curve S4 can be estimated by shifting the initial discharge characteristic curve S0 downward (toward the lower voltage side) in the non-discharged region exceeding 60 Ah in the discharge amount. In this second embodiment, the discharge amount per cycle is a constant value of 60 Ah. Therefore, the initial discharge characteristic curve S0 is parallel shifted downward so as to pass the point S21 on the graph of FIG. 9. The relationship between the discharge voltage and the discharge current shown in FIG. 8 is referred to as V-I characteristics.

As apparent from the foregoing description, even in the discharge characteristics of 2 kW, it is possible to estimate the discharge characteristic curve (curve S4) by parallel shifting the initial discharge characteristic curve uniformly by an amount corresponding to a predetermined voltage drop.

Figure 6:
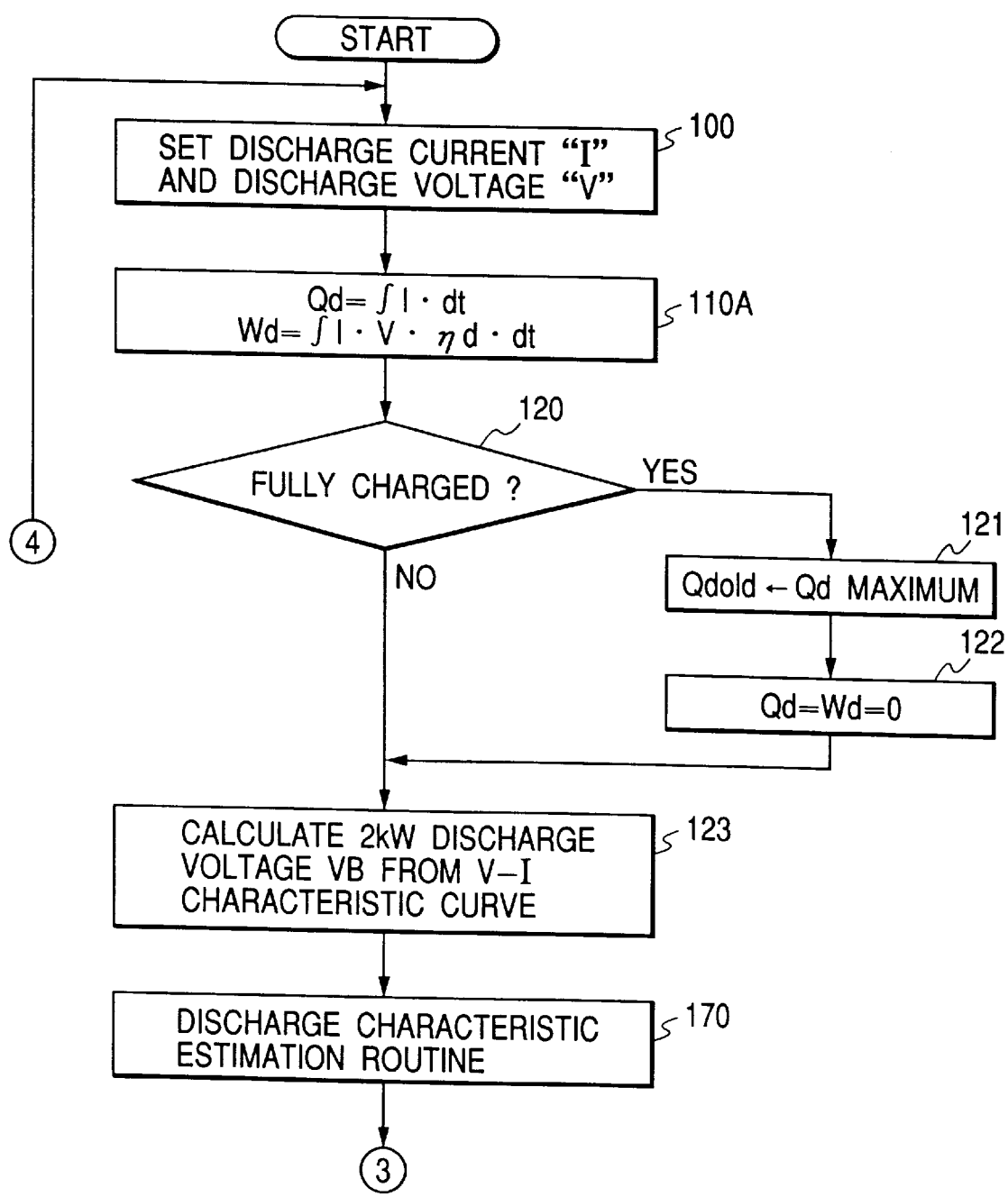
FIG. 6 is the former part of a flowchart of the main control routine executed in the microcomputer in accordance with a second embodiment of the present invention.
Figure 7:
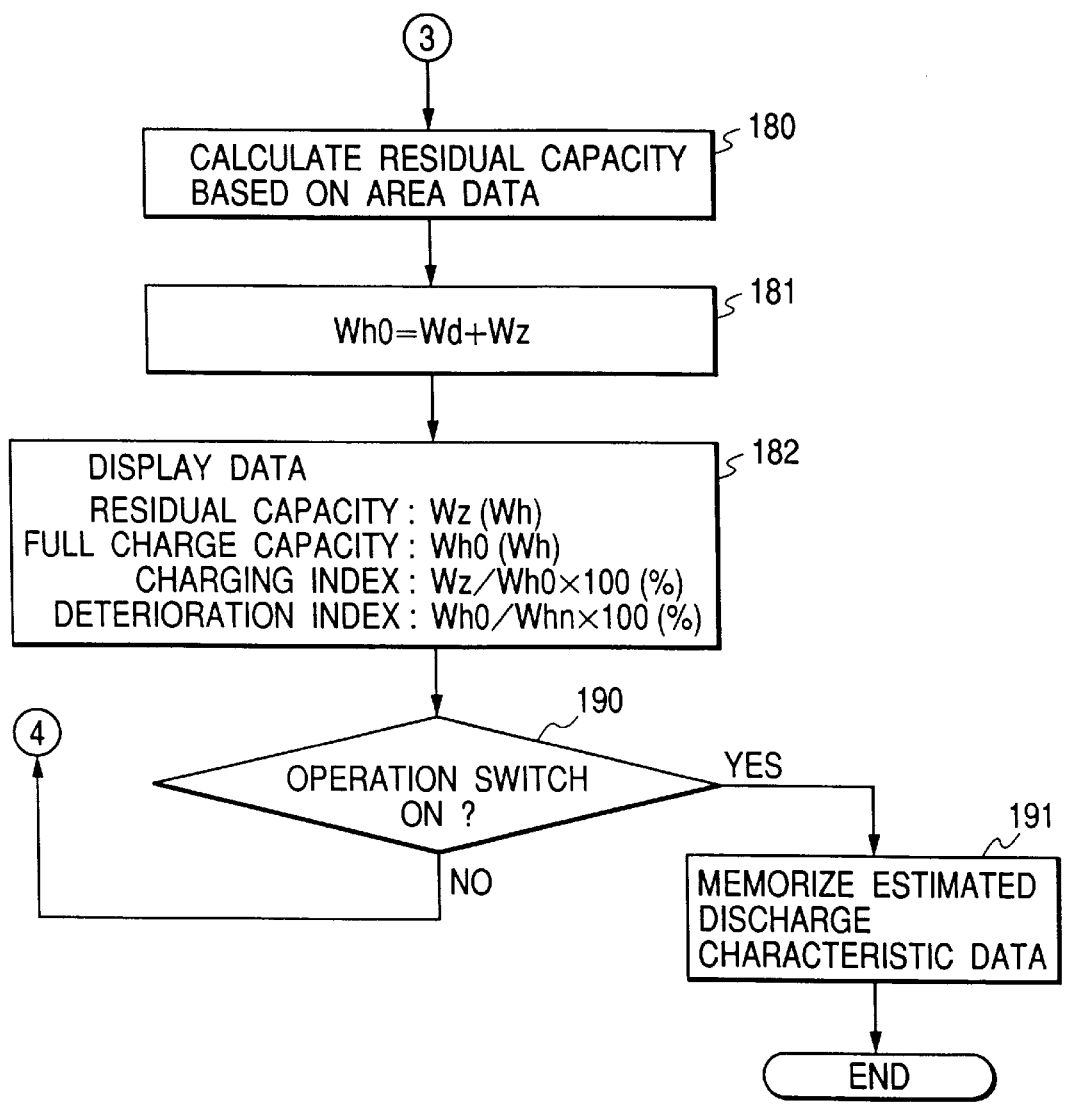
FIG. 7 is the latter part of the flowchart in accordance with the second embodiment of the present invention.

The flowchart of FIGS. 6 and 7 is based on the above-described consideration.

The determination of the residual capacity=0 is flexible dependent on a system incorporating the battery. For example, when the maximum discharge current increases up to 250 (A) in a used system, a reference point is set to a discharge voltage that cannot maintain the discharge current 250A. Then, the residual capacity=0 is determined based on this reference point. The rest of the arrangement is substantially identical with those of the first embodiment.

In the second embodiment having the above-described arrangement, the microcomputer 50 performs the step 100 in the same manner as in the first embodiment. Then, the next step 110A calculates a discharge energy amount Wd of the Ni—MH battery 10 in addition to the discharge amount Qd. The discharge energy amount Wd is obtained as an integrated value based on the following equation.

$$Wd = \int I \cdot V \cdot \eta \, dt \, (Wh) \quad (3)$$

where η represents a charging efficiency of the Ni—MH battery 10.

Then, the microcomputer 50 performs the steps 120 through 122 in the same manner as in the above-described first embodiment.

Subsequently, in step 123, the discharge voltage VB corresponding to the 2 kW discharge operation is calculated based on the discharge current I and the discharge voltage V obtained in the step 100.

In obtaining the V-I characteristics shown in FIG. 8, the microcomputer 50 samples current and voltage data of a plurality of batteries during a term that their capacity changes can be negligible, and performs an approximate calculation of a straight line based on a least square method to calculate an intersecting point of the straight line and the curve P of V×I=2 kW.

In the next step 170, the discharge characteristic curve is estimated in the same manner as the steps 130, 151 through 161 described in the first embodiment. The microcomputer 50 stores the initial discharge characteristics of curve S0 shown in FIG. 9 beforehand in its ROM.

In step 180 shown in FIG. 7, the residual capacity of the Ni—MH battery 10 is calculated. As described above, the residual capacity in this embodiment is a total energy amount discharged until the discharge operation of 2 kW is substantially stopped. Therefore, this energy amount can be calculated based on the discharge characteristic curve estimated in the step 170.

Figure 10:
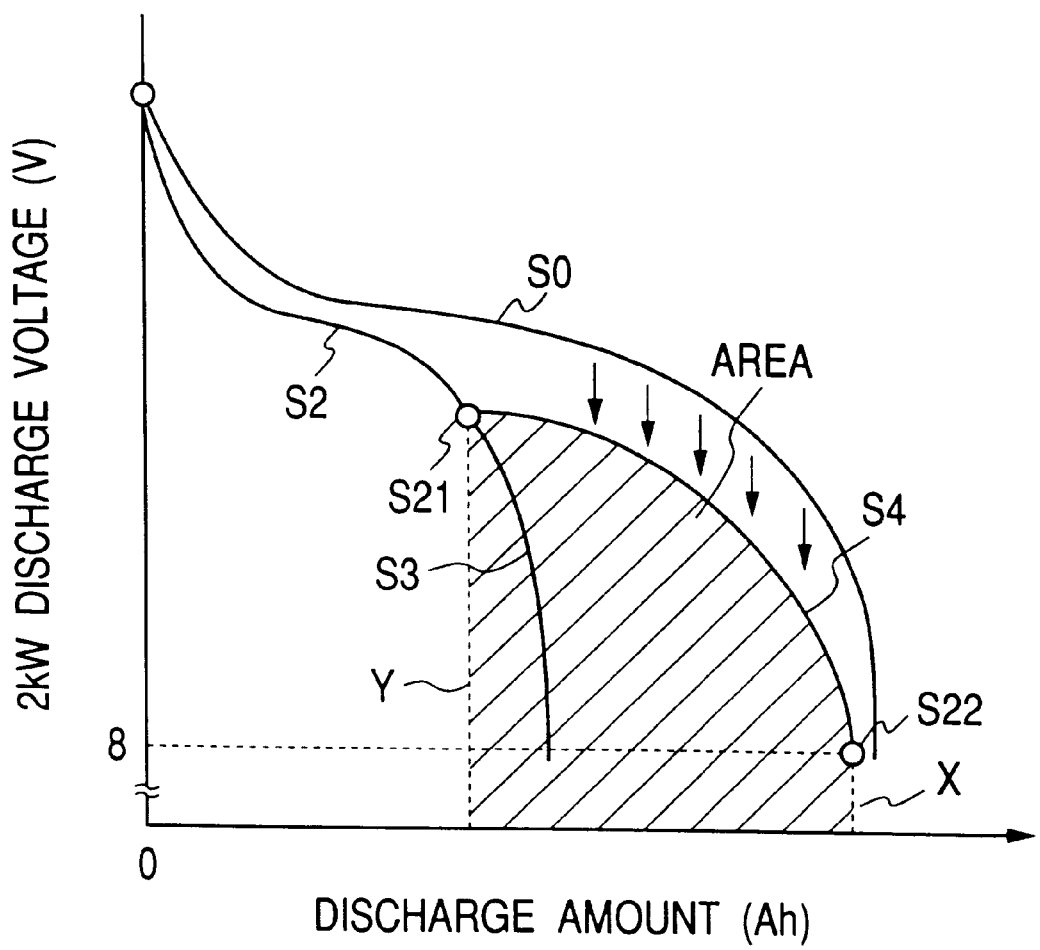
FIG. 10 is a graph showing essential curves selectively extracted from FIG. 9.

More specifically, FIG. 10 shows a 2 kW discharge condition wherein the Ni—MH battery 10 discharged along the curve S2 until the discharge amount reached the point S21. In this condition, the residual capacity is represented by an shaded Area enclosed by two lines X and Y parallel to the ordinate, an abscissa passing the origin, and the curve S4. FIG. 10 shows the essential curves selectively extracted from FIG. 9.

In this case, the discharge characteristics along the curve S2 reaching the point S21 as well as the discharge characteristics along the curve S3 are estimated based on the initial discharge characteristics (S0) in the step 130. Meanwhile, the discharge characteristics of curve S4 is estimated in the step 151.

The discharge characteristic curves S3 and S4 vary momentarily. Thus, the residual capacity (Wz) of the Ni—MH battery 10 needs to be corrected during a discharge operation. The residual capacity Wz represented by the shaded Area shown in FIG. 10 is calculated based on the thus momentarily corrected discharge characteristics.

As described above, the residual capacity calculation is performed by integrating the discharge voltage along the estimated discharge characteristic curve reaching a terminal point where the Ni—MH battery 10 is fully discharged. In other words, the calculated residual capacity reflects the magnitude (high or low) of the discharge voltage of the Ni—MH battery 10. Hence, compared with a case where the magnitude of the discharge voltage of the Ni—MH battery 10 is not considered, no error is involved in the calculation of the residual capacity. Accuracy in the calculation is increased because the residual capacity of the battery is considered as an available (or remaining) energy.

Thereafter, in step 181, a full charge amount Wh0 of the Ni—MH battery 10 is calculated based on the residual capacity Wz and the energy amount Wd using the following equation.

$$Wh0 = Wd + Wz \, (Wh) \quad (4)$$

In the next step 182, the display unit 60 displays various information relating to the Ni—MH battery 10, such as residual capacity Wz (Wh), full charge amount Wh0 (Wh), charge index (Wz/Wh0)×100%, and deterioration index (Wh0/Whn)×100%. In this case, Whn represents a measured energy amount in a full charge condition of a brand-new Ni—MH battery 10.

Subsequently, step 190 makes a judgement to check whether the operation switch SW is turned on. When the operation switch SW is turned on (i.e., YES in step 190), the data of the estimated discharge characteristics is memorized in a volatile memory in the microcomputer 50 (step 191).

Various Modifications

The present invention is not limited to a Ni—MH battery and, therefore, applied to any other batteries causing the memory effect.

In the calculation of the discharge amount Qd in the steps 110 and 110A, it is preferable to add a regenerative charging amount of the Ni—MH battery 10.

In the estimation of the step 151, it is possible to use a discharge characteristic curve of an equivalent battery which is formed by parallel shifting the initial discharge characteristic curve of the Ni—MH battery 10 so that a calculative discharge voltage corresponding to the discharge amount calculated in the step 110 coincides with the actual discharge voltage measured by the voltmeter 40. In this case, the estimated discharge characteristic curve reflects both the measured discharge voltage and the calculative discharge amount.

When any deterioration of the Ni—MH battery 10 is found in the step 160, it is possible to estimate the discharge characteristic curve reflecting the measured discharge voltage and the calculative discharge amount of the deteriorated Ni—MH battery 10. In this case, the resultant estimated discharge characteristic curve is, for example, a discharge characteristic curve of an equivalent battery formed by analogously or similarly modifying its discharge characteristic curve so as to meet the discharge voltage and corresponding discharge amount data measured after the latest estimation.

Furthermore, the discharge characteristic curve, used in the above-described embodiments for representing the relationship between the discharge voltage and the discharge amount of the Ni—MH battery 10 causing the memory effect, can be replaced by a combination of discharge characteristic curves of a plurality of equivalent batteries having different terminal voltages.

The functions expressed in the steps of the flowcharts of the above-described embodiments of the present invention can be realized by any other equivalent arrangement including a system comprising hardware components.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A residual capacity detecting apparatus for a battery comprising:

voltage measuring means for measuring an actual discharge voltage of a battery which is chargeable and dischargeable repetitively;

current measuring means for measuring an actual discharge current of said battery;

discharge amount calculating means for obtaining a calculative discharge amount of said battery based on said actual discharge current measured by said current measuring means;

discharge voltage determining means for determining a calculative discharge voltage corresponding to said calculative discharge amount obtained by said discharge amount calculating means on an initial discharge characteristic curve of said battery, said initial discharge characteristic curve representing an initial relationship between the discharge voltage and the discharge amount of said battery; and discharge characteristic estimating means for parallel shifting said initial discharge characteristic curve so that said calculative discharge voltage determined by said discharge voltage determining means coincides with said actual discharge voltage measured by said voltage measuring means, thereby obtaining an estimated discharge characteristic curve reflecting said actual discharge voltage and said calculative discharge amount.

2. The residual battery capacity detecting apparatus in accordance with claim 1, further comprising:

deterioration judging means for judging a deterioration of said battery when said actual discharge voltage obtained by said voltage measuring means and a corresponding discharge amount do not meet with said estimated discharge characteristic curve obtained by said discharge characteristic estimating means; and correcting means, responsive to a judgement result of said deterioration judging means, for analogously correcting said estimated discharge characteristic curve so as to match said actual discharge voltage and said corresponding discharge amount.

3. A residual battery capacity detecting apparatus comprising:

voltage measuring means for measuring an actual discharge voltage of a battery which is chargeable and dischargeable repetitively;

current measuring means for measuring an actual discharge current of said battery;

discharge amount calculating means for obtaining a calculative discharge amount of said battery based on said actual discharge current measured by said current measuring means;

discharge voltage determining means for determining a calculative discharge voltage corresponding to said calculative discharge amount obtained by said discharge amount calculating means on an initial discharge characteristic curve of said battery, said initial discharge characteristic curve representing an initial relationship between the discharge voltage and the discharge amount of said battery;

discharge characteristic estimating means for parallel shifting said initial discharge characteristic curve so that said calculative discharge voltage determined by said discharge voltage determining means coincides with said actual discharge voltage measured by said voltage measuring means, thereby obtaining a discharge characteristic curve of an equivalent battery as an estimated discharge characteristic curve reflecting said actual discharge voltage and said calculative discharge amount; and residual capacity calculating means for calculating a residual capacity of said battery by integrating the discharge voltage along said estimated discharge characteristic curve until said battery is fully discharged from said calculative discharge amount.

4. The residual battery capacity detecting apparatus in accordance with claim 3, further comprising:

deterioration judging means for judging a deterioration of said battery when said actual discharge voltage obtained by said voltage measuring means and a corresponding discharge amount do not meet with said estimated discharge characteristic curve obtained by said discharge characteristic estimating means; and deterioration discharge characteristic estimating means, responsive to a judgement of said deterioration judging means, for analogously modifying said estimated discharge characteristic curve so as to obtain the discharge characteristic curve of the equivalent battery, as an estimated discharge characteristic curve matching to said actual discharge voltage and said corresponding discharge amount of said deteriorated battery.

5. A residual battery capacity measuring method comprising the steps of:

estimating a discharge characteristic curve representing a relationship between a discharge voltage and a corresponding discharge amount of a battery which is subjected to a memory effect, as a combination of discharge characteristic curves of a plurality of equivalent batteries having different voltages, said discharge characteristic curves respectively representing a relationship between a discharge voltage and a corresponding discharge amount; and calculating a residual capacity of said battery by integrating a discharge voltage along the estimated discharge characteristic curve until said battery is fully discharged.

* * * * *

UNITED STATES PATENT AND TRADEMARK OFFICE
CERTIFICATE OF CORRECTION

PATENT NO. : 6,057,688
DATED : May 2, 2000
INVENTOR(S) : Kawai et al.

Page 1 of 1

It is certified that error appears in the above-identified patent and that said Letters Patent is hereby corrected as shown below:

Title page,
Please change "[73] Assignee: Denso Corporation, Kariyo, Japan;
Nippon Soken, Inc., Nishio, Japan"

TO

-- [73] Assignee: Denso Corporation, Kariya, Japan;
Nippon Soken, Inc., Nishio, Japan --

Signed and Sealed this

Twentieth Day of November, 2001

Attest:

*Nicholas P. Godici*

NICHOLAS P. GODICI
*Attesting Officer*   *Acting Director of the United States Patent and Trademark Office*